(12) United States Patent
Narita

(10) Patent No.: US 9,837,841 B2
(45) Date of Patent: Dec. 5, 2017

(54) SWITCHING POWER SUPPLY DEVICE

(71) Applicant: ROHM CO., LTD., Kyoto (JP)

(72) Inventor: Fujiaki Narita, Hyogo (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 15/471,747

(22) Filed: Mar. 28, 2017

(65) Prior Publication Data
US 2017/0288434 A1   Oct. 5, 2017

(30) Foreign Application Priority Data

Mar. 29, 2016 (JP) ................. 2016-065881
Mar. 29, 2016 (JP) ................. 2016-065889
Jan. 27, 2017 (JP) ................. 2017-013087

(51) Int. Cl.
| | |
|---|---|
| *H05B 33/08* | (2006.01) |
| *H02M 3/156* | (2006.01) |
| *H02J 7/00* | (2006.01) |
| *H02M 3/335* | (2006.01) |
| *H05B 37/02* | (2006.01) |
| *H02M 1/08* | (2006.01) |
| *H03K 17/687* | (2006.01) |
| *H02M 1/00* | (2006.01) |

(52) U.S. Cl.
CPC ............ *H02J 7/0052* (2013.01); *H02M 1/08* (2013.01); *H02M 3/156* (2013.01); *H02M 3/33523* (2013.01); *H03K 17/687* (2013.01); *H05B 33/0815* (2013.01); *H05B 37/02* (2013.01); *H02J 2007/0059* (2013.01); *H02M 2001/0009* (2013.01)

(58) Field of Classification Search
CPC .... H05B 37/02; H05B 37/0227; H05B 33/08; H05B 33/0815; H05B 33/0842; H02J 7/0052; H02J 2007/0059; H02M 1/08; H02M 1/32; H02M 3/156; H02M 3/33523; H02M 2001/0009; H03K 17/687
USPC ............ 315/209 R, 224–226, 291, 307, 308; 363/15–20, 80, 89, 95, 126, 132; 323/272, 282–285
See application file for complete search history.

(56) References Cited

U.S. PATENT DOCUMENTS 8,299,726 B2 * 10/2012 Holmes .............. H05B 33/0815
                                                           315/291
2017/0063227 A1 * 3/2017 Nakamura ............ H02M 3/158

FOREIGN PATENT DOCUMENTS

JP        2005-142137        6/2005

* cited by examiner

*Primary Examiner* — Jimmy Vu
(74) *Attorney, Agent, or Firm* — Fish & Richardson P.C.

(57) ABSTRACT

A switching power supply device has: a switching output stage configured to generate from an input voltage an output voltage to feed it to a load; a controller IC configured to control the switching output stage such that a feedback voltage applied to an output feedback terminal of the controller IC remains equal to a predetermined reference voltage; a first resistor connected between the output terminal of the output voltage and the output feedback terminal; a second resistor connected between the output feedback terminal and a ground terminal; a sense resistor configured to convert the output current passing between the load and the ground terminal into a sense voltage; and a first diode whose anode is connected to the application terminal of the sense voltage and whose cathode is connected to the output feedback terminal.

19 Claims, 19 Drawing Sheets

US 9,837,841 B2

SWITCHING POWER SUPPLY DEVICE

CROSS-REFERENCE TO RELATED APPLICATIONS

This application is based on the following Japanese patent applications, the contents of which are hereby incorporated by reference:
(1) Japanese Patent Application published as No. 2016-065881 (filed on Mar. 29, 2016)
(2) Japanese Patent Application published as No. 2016-065889 (filed on Mar. 29, 2016)
(3) Japanese Patent Application published as No. 2017-013087 (filed on Jan. 27, 2017)

BACKGROUND OF THE INVENTION

1. Field of the Invention

The invention disclosed herein relates to switching power supply devices.

2. Description of Related Art

Conventionally, a switching power supply device is designed around a controller IC as its core, with various discrete components externally fitted to it.

However, with conventional switching power supply devices, while many examples of design are proposed for constant-voltage power supply circuits, very few examples of design are known for constant-current power supply circuits. Thus, in applications that require a stabilized output current (such as LED (light-emitting diode) lighting devices and battery charging devices), a constant-current power supply circuit needs to be provided separately in the stage succeeding a constant-voltage power supply circuit, inconveniently resulting in increased cost and diminished efficiency.

Incidentally, Patent Document 1 (Japanese Patent Application published as No. 2005-142137) proposes a circuit configuration for furnishing a direct-current power supply device (in particular, an IPD control circuit in it) additionally with a constant-current control function. However, Patent Document 1 gives no consideration to a no-load or low-load condition (a state of the load that makes the output current zero or nearly zero), and thus leaves room for improvement.

SUMMARY OF THE INVENTION

In view of the above-mentioned problems encountered by the present inventor, an object of the invention disclosed herein is to provide a switching power supply device that achieves both constant-current control and constant-voltage control with a simple circuit configuration.

According to one aspect of the invention disclosed herein, a switching power supply device, includes: a switching output stage configured to generate an output voltage from an input voltage and feed the output voltage to a load; a controller IC configured to control the switching output stage such that a feedback voltage applied to an output feedback terminal of the controller IC remains equal to a predetermined reference voltage; a first resistor connected between the output terminal of the output voltage and the output feedback terminal; a second resistor connected between the output feedback terminal and a ground terminal; a sense resistor configured to convert the output current passing between the load and the ground terminal into a sense voltage; and a first diode of which the anode is connected to the application terminal of the sense voltage and of which the cathode is connected to the output feedback terminal.

According to one aspect of the invention disclosed herein, a switching power supply device includes: a switching output stage configured to receive electric power from a primary circuit system and supply an output voltage and an output current to a load provided in a secondary circuit system while electrically isolating between the primary and secondary circuit systems; an output feedback circuit provided in the secondary circuit system and configured to generate a secondary-side feedback current commensurate with the output voltage and the output current; a photocoupler configured to convert the secondary-side feedback current into an optical signal by use of a light-emitting element provided in the secondary circuit system and convert the optical signal into a primary-side feedback current by use of a light-receiving element provided in the primary circuit system; and a controller IC provided in the primary circuit system and configured to control the switching output stage according to the primary-side feedback current passing through an output feedback terminal of the controller IC. Here, the output feedback circuit includes: a shunt regulator configured to control the secondary-side feedback current according to a control voltage applied to the control terminal of the shut regulator; a first resistor connected between the output terminal of the output voltage and the control terminal; a second resistor connected between the control terminal and a ground terminal; a sense resistor configured to convert the output current into a sense voltage; and a first diode of which the anode is connected to the application terminal of the sense voltage or of a voltage commensurate with it and of which the cathode is connected to the control terminal.

DETAILED DESCRIPTION OF PREFERRED EMBODIMENTS

First Embodiment

Figure 1:
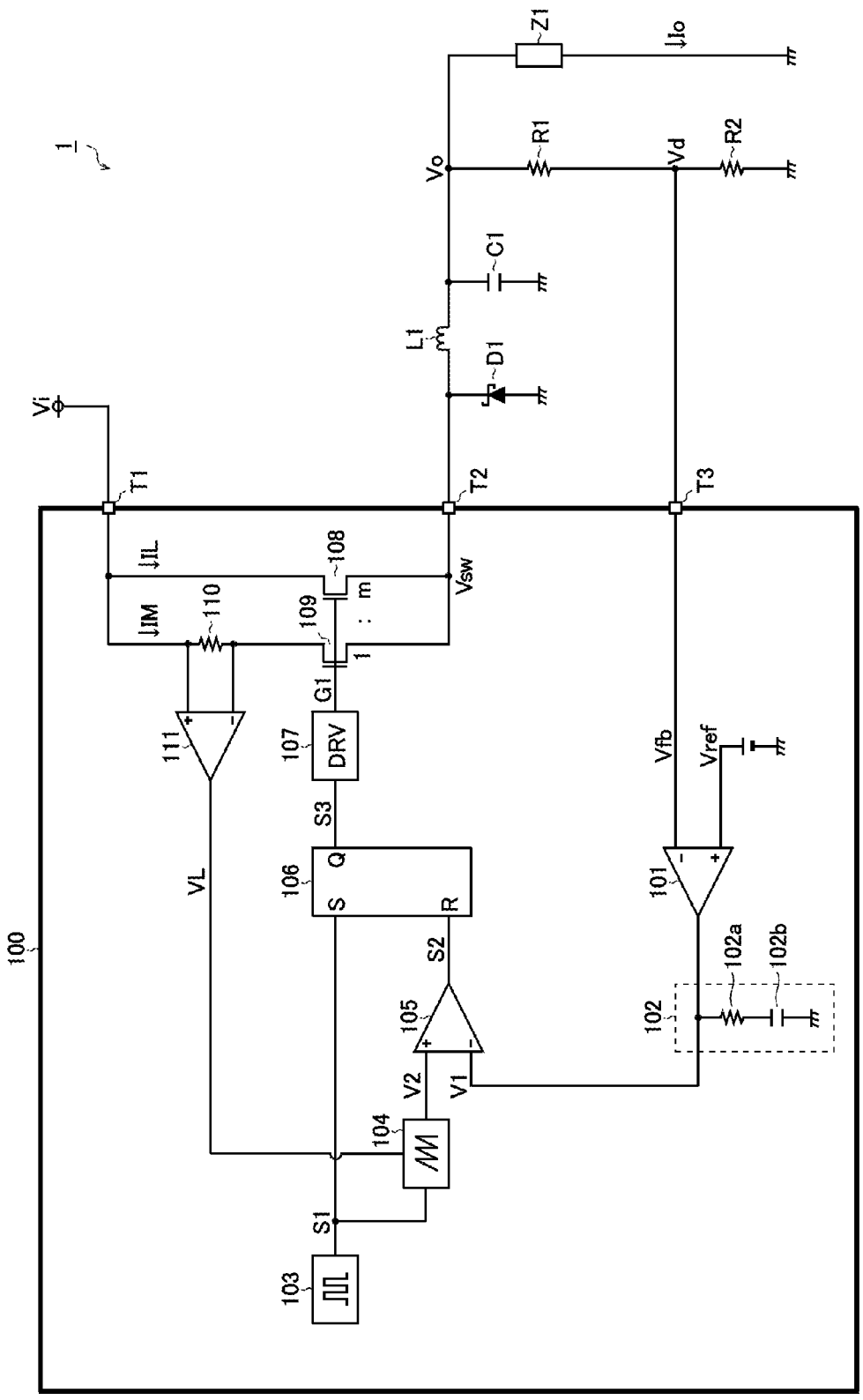
FIG. 1 is a circuit block diagram showing a switching power supply device according to a first embodiment.

FIG. 1 is a block diagram showing a switching power supply device according to a first embodiment (serving as a first reference example that helps understand the features of a third and following embodiments). The switching power supply device 1 of this embodiment is a non-isolated step-down DC-DC converter that steps down an input voltage Vi and thereby generates a desired output voltage Vo to supply it to a load Z1, and includes a controller IC 100 and various discrete components that are externally connected to it (an output inductor L1, a rectification diode D1, an output capacitor C1, and voltage division resistors R1 and R2).

The controller IC 100 has, as means for establishing electrical connection with outside the IC, an external terminal (power terminal) T1, an external terminal (switching terminal) T2, and an external terminal (output feedback terminal) T3.

First, the interconnection outside the controller IC 100 will be described. The external terminal T1 is connected to the input terminal of the input voltage Vi. The external terminal T2 is connected to the first terminal of the output inductor L1 and to the cathode of the rectification diode D1 (for example, a Shottky-barrier diode). The anode of the rectification diode D1 is connected to the ground terminal. The second terminal of the output inductor L1 is connected to the output terminal of the output voltage Vo (that is, the high-potential terminal of the load Z1). The low-potential terminal of the load Z1 is connected to the ground terminal. The output capacitor C1 is connected between the output terminal of the output voltage Vo and the ground terminal.

The output inductor L1, the rectification diode D1, and the output capacitor C1 connected together as described above constitute, along with an output transistor 108 incorporated in the controller IC 100, a step-down switching output stage, which generates the output voltage Vo by rectifying and smoothing a switching voltage Vsw with a square waveform that appears at the external terminal T2.

The voltage division resistor R1 is connected between the output terminal of the output voltage Vo and the external terminal T3. The voltage division resistor R2 is connected between the external terminal T3 and the ground terminal. Thus connected in series between the output terminal of the output voltage Vo and the ground terminal, the voltage division resistors R1 and R2 function as a voltage division circuit that outputs, from the connection node between them, a division voltage Vd (=Vo×[R2/(R1+R2)]) of the output voltage Vo. Though not illustrated in FIG. 1, a speed-up capacitor may be connected in parallel across the voltage division resistor R1 to ensure smooth start-up of the switching power supply device 1.

Next, the internal configuration and operation of the controller IC 100 will be described. The controller IC 100 is a monolithic semiconductor integrated circuit device that controls the above-mentioned switching output stage (in particular, the output transistor 108) such that a feedback voltage Vfb (in the first embodiment, the division voltage Vd) that is applied to the external terminal T3 remains equal to a predetermined reference voltage Vref, and includes an error amplifier 101, a phase compensation filter 102, a clock signal generation circuit 103, a slope voltage generation circuit 104, a PWM comparator 105, a logic circuit 106, a gate driving circuit 107, an output transistor 108, a sense transistor 109, a sense resistor 110, and a sense amplifier 111.

In addition to the circuit elements mentioned above, the controller IC 100 may further incorporate, as necessary, various protection circuits (such as a low-input malfunction prevention circuit, a temperature protection circuit, an over-current protection circuit, and an overvoltage protection circuit).

The error amplifier 101 generates an error voltage V1 that is commensurate with the difference between the feedback voltage Vfb, which is fed to the inverting input terminal (−) of the error amplifier 101, and the reference voltage Vref, which is fed to the non-inverting input terminal (+) of the error amplifier 101. The error voltage V1 rises when the feedback voltage Vfb is lower than the reference voltage Vref, and falls when the feedback voltage Vfb is higher than the reference voltage Vref.

The phase compensation filter 102 includes a resistor 102a and a capacitor 102b that are connected in series between the output terminal of the error amplifier 101 (that is, the application terminal of the error voltage V1) and the ground terminal, and compensates the phase of the error voltage V1 to prevent oscillation of the error amplifier 101.

The clock signal generation circuit 103 generates a clock signal S1 with a square waveform that is pulse-driven at a predetermined switching frequency fsw.

The slope voltage generation circuit 104 generates a slope voltage V2 with a triangular waveform, a saw-tooth waveform, or an n-th order slope waveform (where, for example, n=2) in synchronism with the clock signal S1. The slope voltage generation circuit 104 also has the function of giving an offset to the slope voltage V2 in accordance with an inductor current detection voltage VL (which is a voltage signal that simulates the behavior of an inductor current IL).

The PWM comparator 105 generates a comparison signal S2 by comparing the error voltage V1, which is fed to the inverting input terminal (−) of the PWM comparator 105, with the slope voltage V2, which is fed to the non-inverting input terminal (+) of the PWM comparator 105. The comparison signal S2 is at LOW level when the slope voltage V2 is lower than the error voltage V1, and is at HIGH level when the slope voltage V2 is higher than the error voltage V1.

The logic circuit 106 is an RS flip-flop that generates a PWM signal S3 according to the clock signal S1, which is fed to the set terminal (S) of the logic circuit 106, and the comparison signal S2, which is fed to the reset terminal (R) of the logic circuit 106. The PWM signal S3 is set to HIGH level at a pulse edge in the clock signal S1, and is reset to LOW level at a pulse edge in the comparison signal S2.

The gate driving circuit 107 generates a gate signal G1 in response to the PWM signal S3. The gate signal G1 is at LOW level when the PWM signal S3 is at HIGH level, and is at HIGH level when the PWM signal S3 is at LOW level.

The output transistor 108 is a semiconductor switching device that constitutes the above-mentioned switching output stage, and used as the output transistor 108 in FIG. 1 is an NMOSFET (N-channel metal-oxide-semiconductor field-effect transistor). The drain of the output transistor 108 is connected to the external terminal T1. The source of the output transistor 108 is connected to the external terminal T2. The gate of the output transistor 108 is connected to the output terminal of the gate driving circuit 107 (that is, the application terminal of the gate signal G1). The output transistor 108 is ON when the gate signal G1 is at HIGH level, and is OFF when the gate signal G1 is at LOW level. As the output transistor 108, a PMOSFET (P-channel metal-oxide-semiconductor field-effect transistor) may instead be used. Instead of the output transistor 108 being incorporated in the controller IC 100, it may be externally fitted to the controller IC 100.

The sense transistor 109 is a semiconductor switching device that is connected in parallel with the output transistor 108, with their respective gates connected together. As the sense transistor 109, like the output transistor 108, an NMOSFET is used. Accordingly, the output transistor 108 and the sense transistor 109 are turned ON and OFF synchronously according to the gate signal G1 common to them. The size ratio of the sense transistor 109 to the output transistor 108 is set by design at 1:m (for example, m=1000). Accordingly, a monitor current IM through the sense transistor 109 equals 1/m of the inductor current IL through the output transistor 108.

The sense resistor 110 (with a resistance value R110) is provided in the current path of the monitor current IM (in FIG. 1, between the external terminal T1 and the drain of the sense transistor 109), and generates across it a voltage (=IM×R110) that is commensurate with the monitor current IM.

The sense amplifier 111 amplifies the voltage across the sense resistor 110 and thereby generates the inductor current detection voltage VL to output it to the slope voltage generation circuit 104.

The configuration described above, that is, one that includes a sense transistor 109, a sense resistor 110, and a sense amplifier 111, achieves output feedback control by current mode control in the switching output stage. This helps enhance the stability of the output feedback loop, and also helps improve the transient response against variation of load.

On the other hand, in cases where output feedback control by voltage mode control suffices, the sense transistor 109, the sense resistor 110, and the sense amplifier 111 mentioned above may be omitted so that the controller IC 100 has a simpler circuit configuration.

As described above, the switching power supply device 1 of this embodiment exemplifies a design as a constant-voltage power supply circuit. For example, setting R1=51 kΩ, R2=5.1 kΩ, L1=22 pH, C1=270 µF, and Vref=0.8V provides a constant-voltage power supply circuit with the specifications: input voltage Vi=9 to 18V; output voltage Vo=8.8V; and maximum output current Io(max)=2.0 A.

Second Embodiment

Figure 2:
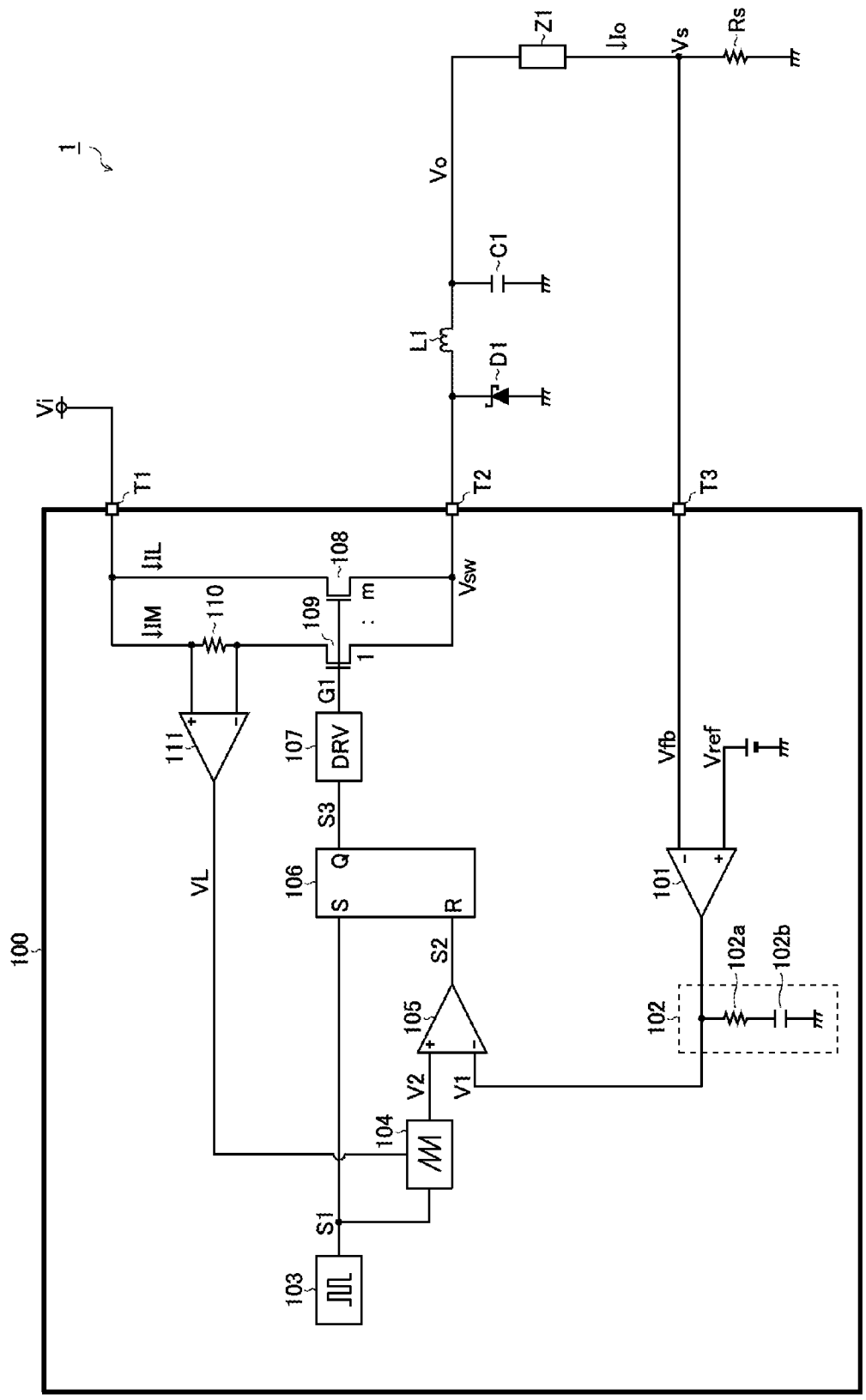
FIG. 2 is a circuit block diagram showing a switching power supply device according to a second embodiment.

FIG. 2 is a block diagram showing a switching power supply device according to a second embodiment (serving as a second reference example that helps understand the features of a third and following embodiments). The switching power supply device 1 of this embodiment is based on the first embodiment but is modified, in part of the components that are externally fitted to the controller IC 100, so as to operate as a constant-current power supply circuit instead of a constant-voltage power supply circuit. Accordingly, such elements as find their counterparts in the first embodiment are identified by the same reference signs as in FIG. 1 and no overlapping description will be repeated; the following description thus focuses on features unique to this embodiment.

In the switching power supply device 1 of this embodiment, in place of the voltage division resistors R1 and R2 mentioned previously, a sense resistor Rs is provided. The sense resistor Rs is connected between the low-potential terminal of the load Z1 and the ground terminal, and converts into a sense voltage Vs the output current Io that passes from the load Z1 to the ground terminal. The sense voltage Vs is a voltage signal (=Io×Rs) that is proportional to the output current Io, and is applied, in place of the division voltage Vd mentioned previously, to the external terminal T3 of the controller IC 100.

Modified as described above, the switching power supply device 1 of this embodiment operates as a constant-current power supply circuit instead of a constant-voltage power supply circuit.

Figure 3:
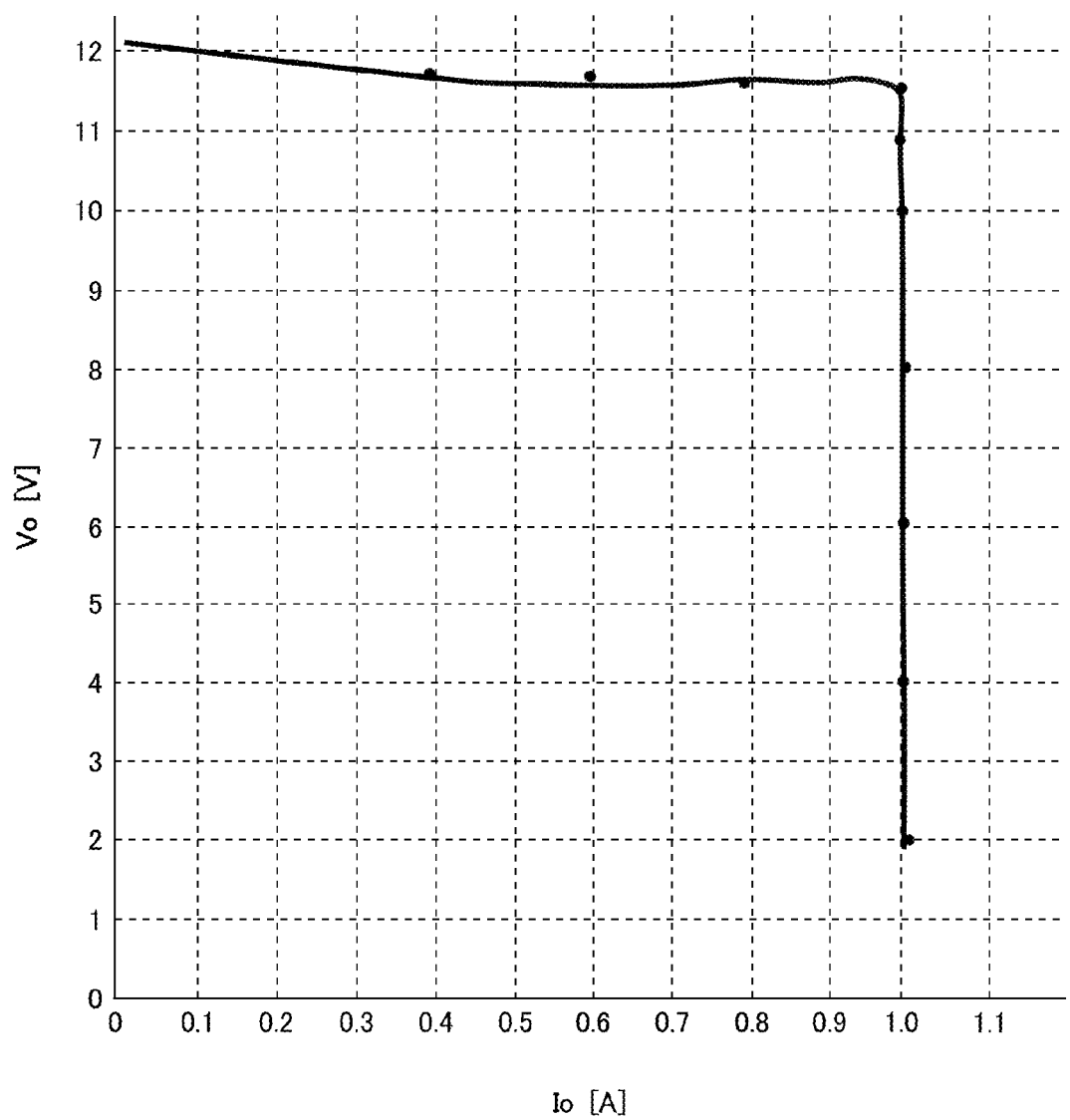
FIG. 3 is an output characteristics diagram of the second embodiment.

FIG. 3 is a diagram showing the output characteristics observed when Vi=12 V, L1=22 pH, C1=270 µF, Rs=0.8Ω, and Vref=0.8 V in the switching power supply device 1 of the second embodiment. In the diagram, the horizontal axis represents the output current Io [A], and the vertical axis represents the output voltage Vo [V].

As depicted in FIG. 3, obtained is a constant-current power supply circuit of which the output current Io is constantly 1 A (=0.8 V/0.8Ω) so long as the output voltage Vo is in the range of 2 V to 11.5 V (that is, so long as the load Z1 is in the range of 2Ω to 11.5Ω). Incidentally, with the output voltage Vo at 10 V, an excellent efficiency η of 96% is achieved.

However, the switching power supply device 1 of this embodiment has a downside: in a no-load condition with the output current Io zero (or in a low-load condition comparable to it), output feedback control operates so as to keep the ON duty of the output transistor 108 at its maximum (or a value close to it), with the result that the output voltage Vo rises up to the input voltage Vi (or a value close to it), possibly exerting an adverse effect on the load Z1.

Third Embodiment

Figure 4:
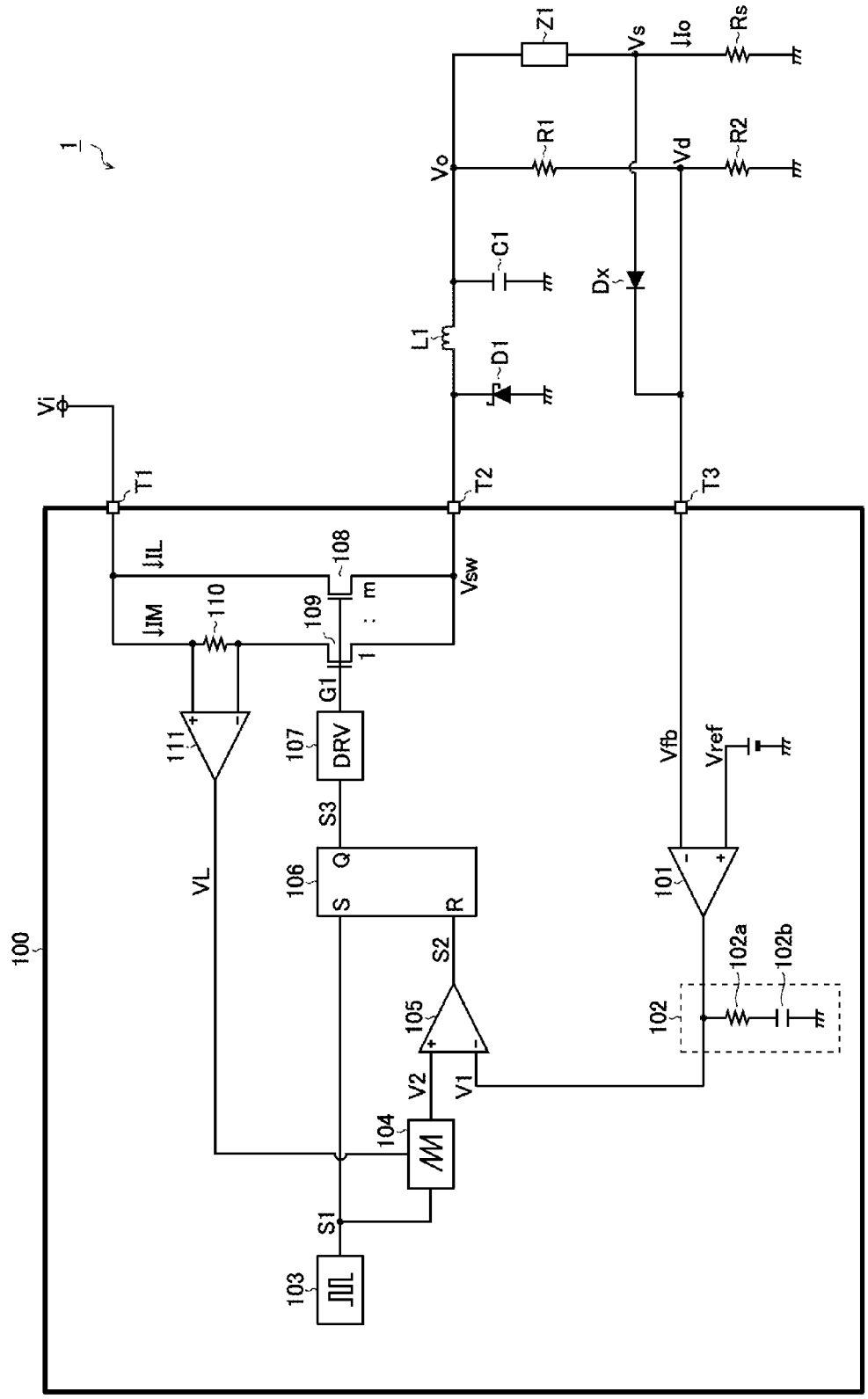
FIG. 4 is a circuit block diagram showing a switching power supply device according to a third embodiment.

FIG. 4 is a circuit block diagram showing a switching power supply device according to a third embodiment. The switching power supply device 1 of this embodiment is based on both the first and second embodiments described previously but is modified, in part of the discrete components externally fitted to the controller IC 100, so as to avoid an excessive rise in the output voltage Vo even in a no-load condition (or low-load condition). Accordingly, such elements as find their counterparts in the first and second embodiments are identified by the same reference signs as in FIGS. 1 and 2 and no overlapping description will be repeated; the following description thus focuses on features unique to this embodiment.

The switching power supply device 1 of this embodiment includes both voltage division resistors R1 and R2 like those in the first embodiment (FIG. 1) and a sense resistor Rs like the one in the second embodiment (FIG. 2), and still additionally includes a diode Dx. The anode of the diode Dx is connected to the application terminal of the sense voltage Vs. The cathode of the diode Dx is connected to the external terminal T3.

Thus, in the switching power supply device 1 of this embodiment, dominant as the feedback voltage Vfb applied to the external terminal T3 of the controller IC 100 is whichever is higher of the division voltage Vd, which is commensurate with the output voltage Vo, and the sense voltage Vs (more precisely, Vs−Vfx, where Vfx is the forward voltage drop across the diode Dx), which is commensurate with the output current Io).

For example, in a high-load condition where the output current Io is higher than a predetermined value (=(Vd+Vfx)/Rs)), the sense voltage (Vs−Vfx) is higher than the division voltage Vd. Accordingly, in the controller IC 100, output feedback control is performed such that the sense voltage (Vs−Vfx) remains equal to the reference voltage Vref. As a result, the switching power supply device 1 operates as a constant-current power supply circuit, and thus the output current Io is kept at the target value (=(Vref+Vfx)/Rs).

In a high-load condition as mentioned above, the diode Dx is forward-biased; thus, separate from the current path that leads from the load Z1 via the sense resistor Rs to the ground terminal, another current path is formed that leads from the load Z1 via the rectification diode D1 and the resistor R2 to the ground terminal. Here, giving the resistor R2 and the sense resistor Rs resistance values such that R2>>Rs permits almost all the output current Io to pass along the current path via the sense resistor Rs, and thus the constant-current control on the output current Io is not hindered.

On the other hand, in a no-load or low-load condition where the output current Io is lower than the above-mentioned predetermined value (=(Vd+Vfx)/Rs)), the division voltage Vd is higher than the sense voltage (Vs−Vfx). Accordingly, in the controller IC 100, output feedback control is performed such that the division voltage Vd remains equal to the reference voltage Vref. As a result, the switching power supply device 1 operates as a constant-voltage power supply circuit, and thus the output voltage Vo is kept at the target value (=Vref×[(R1+R2)/R2]).

In a no-load or low-load condition as mentioned above, the diode Dx is reverse-biased; thus, no current passes from the application terminal of the division voltage Vd to the application terminal of the sense voltage Vs.

As described above, with the switching power supply device 1 of this embodiment, by use of a controller IC 100 that has only a single output feedback terminal (the external terminal T3), it is possible to achieve both constant-current control and constant-voltage control.

In particular, with the switching power supply device 1 of this embodiment, even in a no-load or low-load condition, the output voltage Vo does not rise beyond a predetermined upper limit value (=Vref×[(R1+R2)/R2]), and this helps alleviate an adverse effect on the load Z1.

In a case where what is connected as the load Z1 requires constant-current control, such as a current-driven light-emitting device (for example, an LED device) or a battery, adopting this embodiment is very effective from the viewpoints of enhancing efficiency and improving safety, and an increasingly wide range of application is expected in the future.

Fourth Embodiment

Figure 5:
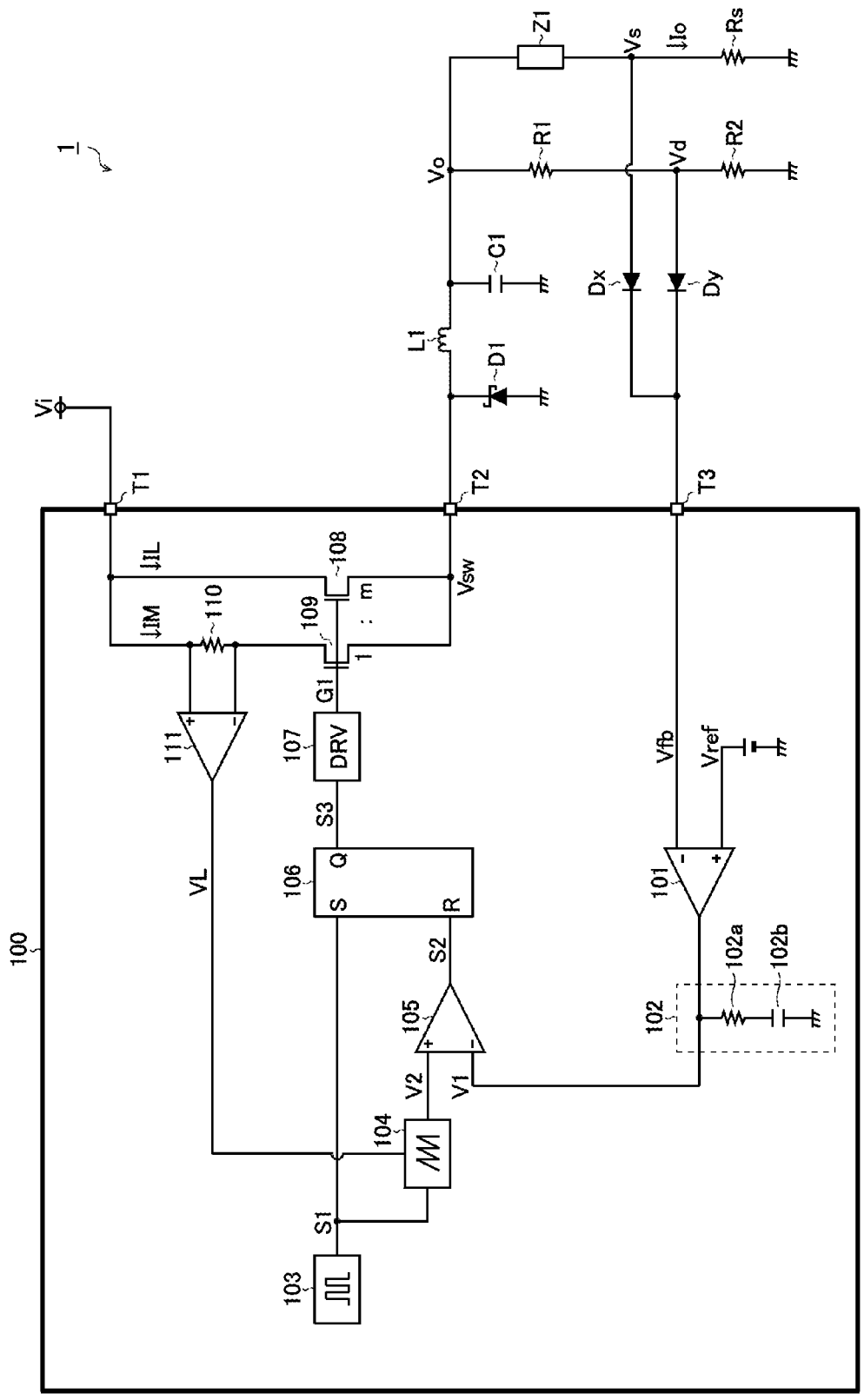
FIG. 5 is a circuit block diagram showing a switching power supply device according to a fourth embodiment.

FIG. 5 is a circuit block diagram showing a switching power supply device according to a fourth embodiment. The switching power supply device 1 of this embodiment is based on the third embodiment described previously and is characterized by further including a diode Dy. Accordingly, such elements as find their counterparts in the third embodiment are identified by the same reference signs as in FIG. 4 and no overlapping description will be repeated; the following description thus focuses on features unique to this embodiment.

The anode of the diode Dy is connected to the connection node between the resistors R1 and R2 (that is, the application terminal of the division voltage Vd). The cathode of the diode Dy is connected to the external terminal T3. With this configuration, in a high-load condition where the output current Io is higher than a predetermined value (=(Vd+Vfx)/Rs), the diode Dx is forward-biased, and the diode Dy is reversed-biased. This completely shuts off the output current Io, which would otherwise divert itself to the voltage division resistor R2. Needless to say, as mentioned previously, so long as R2>>Rs, almost all the output current Io passes through the sense resistor Rs, and therefore the diode Dy is not an essential element.

In the switching power supply device 1 of this embodiment, constant-current control and constant-voltage control are switched according to the result of comparison of the division voltage (Vd−Vfy, where Vfy is the forward voltage drop across the diode Dy) with the sense voltage (Vs−Vfx). Accordingly, pairing the diodes Dx and Dy such that Vfx=Vfy eliminates the need to consider the forward voltage drops Vfx and Vfy in diode OR operation, and this makes it possible to compare the division voltage Vd with the sense voltage Vs as they are.

The addition of the diode Dy adds the term of the forward voltage drop Vfy to the target value of the output voltage Vo under constant-voltage control (making it (Vref+Vfy)×[(R1+R2)/R2]).

Fifth Embodiment

Figure 6:
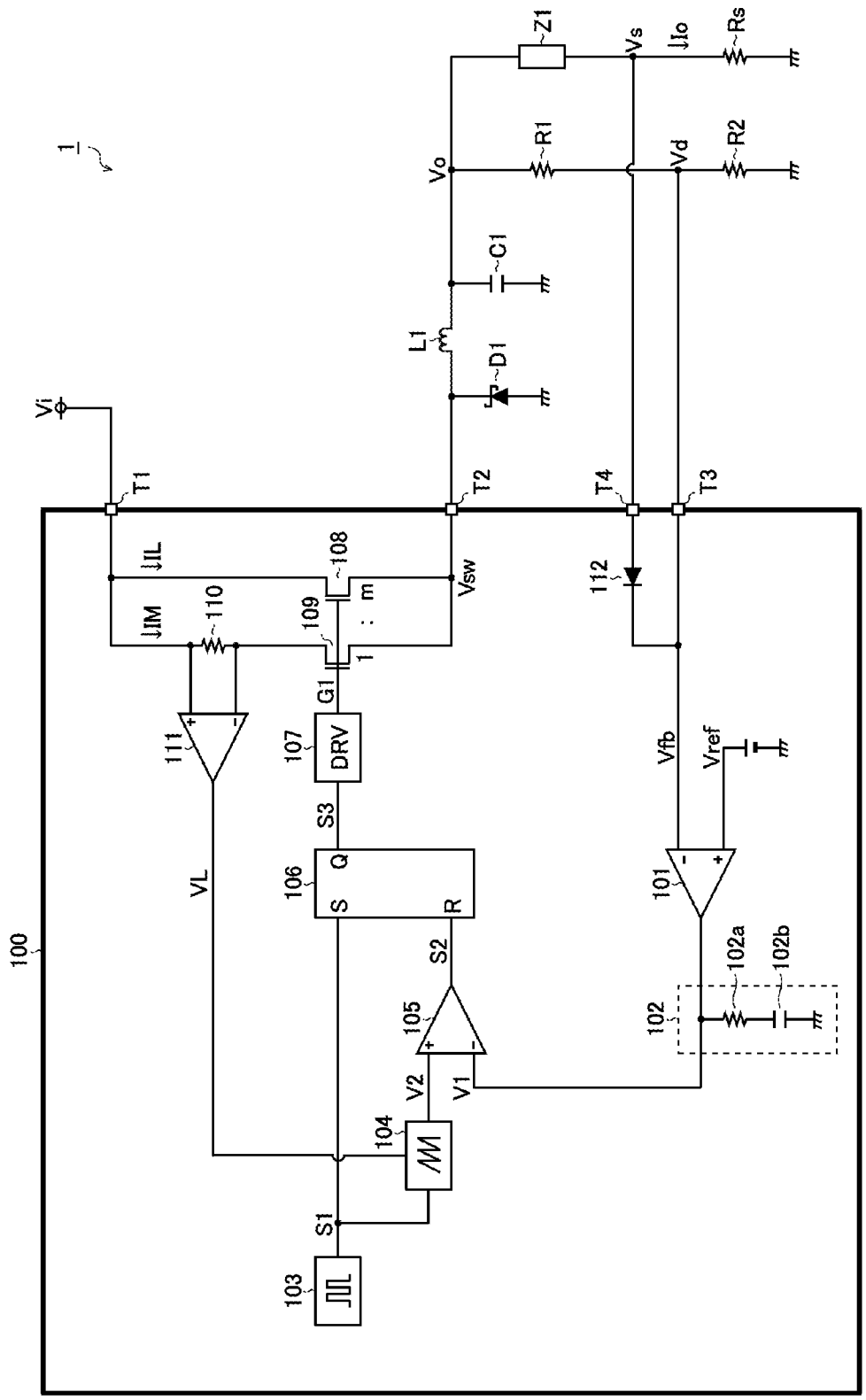
FIG. 6 is a circuit block diagram showing a switching power supply device according to a fifth embodiment.

FIG. 6 is a circuit block diagram showing a switching power supply device according to a fifth embodiment. The switching power supply device 1 of this embodiment is based on the third embodiment described previously and is characterized in that, in place of the diode Dx, a diode 112 equivalent to it is incorporated in the controller IC 100. Accordingly, such elements as find their counterparts in the third embodiment are identified by the same reference signs as in FIG. 4 and no overlapping description will be repeated; the following description thus focuses on features unique to this embodiment.

The cathode of the diode 112 is connected, inside the controller IC 100, to the external terminal T3. The anode of the diode 112 is connected, inside the controller IC 100, to an additional external terminal (output current detection terminal) T4 of the controller IC 100. The external terminal T4 is connected, outside the controller IC 100, to the application terminal of the sense voltage Vs.

This configuration eliminates the need for the externally fitted diode Dx, and thus helps achieve size reduction and cost reduction in the switching power supply device 1.

Sixth Embodiment

Figure 7:
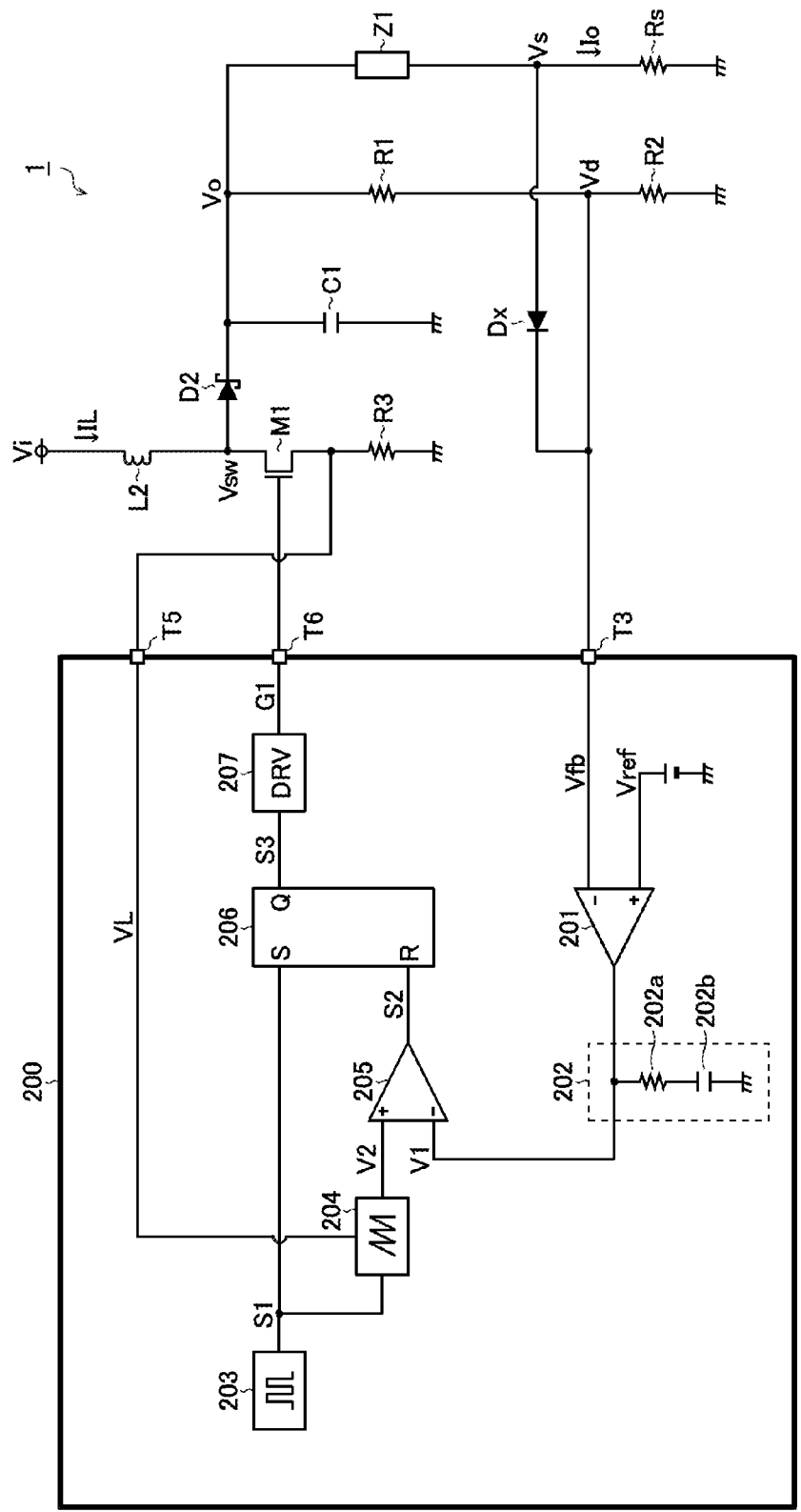
FIG. 7 is a circuit block diagram showing a switching power supply device according to a sixth embodiment.

FIG. 7 is a circuit block diagram showing a switching power supply device according to a sixth embodiment. The switching power supply device 1 of this embodiment is based on the third embodiment described previously and is characterized in that the switching output stage is changed from a step-down type to a step-up type. Accordingly, such elements as find their counterparts in the third embodiment are identified by the same reference signs as in FIG. 4 and no overlapping description will be repeated; the following description thus focuses on features unique to this embodiment.

The switching power supply device 1 of this embodiment is a non-isolated step-up DC-DC converter that steps up an input voltage Vi and thereby generates a desired output voltage Vo to supply it to a load Z1, and includes a controller IC 200 and various discrete components that are externally connected to it (an output transistor M1, an output inductor L2, a rectification diode D2, an output capacitor C1, voltage division resistors R1 and R2, and sense resistors Rs and R3).

The controller IC 200 has, as means for establishing electrical connection with outside the IC, an external terminal (current sense terminal) T5, an external terminal (gate terminal) T6, and an external terminal (output feedback terminal) T3.

First, the interconnection outside the controller IC 200 will be described. The first terminal of the output inductor L2 is connected to the input terminal of the input voltage Vi. The second terminal of the output inductor L2 is connected to the drain of the output transistor M1 (here, an NMOS-FET). The source of the output transistor M1 is connected to the external terminal T4 and to the first terminal of the sense resistor R3 (that is, the application terminal of the inductor current detection voltage VL). The second terminal of the sense resistor R3 is connected to the ground terminal. The gate of the output transistor M1 is connected to the external terminal T6. The anode of the rectification diode D2 (for example, a Shottky-barrier diode) is connected to the drain of the output transistor M1. The cathode of the rectification diode D2 is connected to the output terminal of the output voltage Vo (that is, the high-potential terminal of the load Z1).

The output transistor M1, the output inductor L2, the rectification diode D2, and the output capacitor C1 connected together as described above constitute a step-up switching output stage. In other respects, the interconnection here is similar to that in FIG. 4.

Next, the internal configuration and operation of the controller IC 200 will be described. The controller IC 200 is a monolithic semiconductor integrated circuit device that controls the above-mentioned switching output stage (in particular, the output transistor M1) such that the feedback voltage Vfb applied to the external terminal T3 remains equal to the predetermined reference voltage Vref, and includes an error amplifier 201, a phase compensation filter 202, a clock signal generation circuit 203, a slope voltage generation circuit 204, a PWM comparator 205, a logic circuit 206, and a gate driving circuit 207.

The above-mentioned elements 201 to 207 corresponds to the elements 101 to 107 in FIG. 4, operating basically in similar manners respectively. However, in the switching power supply device 1 of this embodiment, where the output transistor M1 is provided as a discrete component, the gate signal G1 for the output transistor M1 is applied to its gate from the gate driving circuit 207 via the external terminal T6.

Moreover, in the switching power supply device 1 of this embodiment, where the inductor current detection voltage VL ($=IL \times R3$) is generated by use of the externally fitted sense resistor R3, the controller IC 200 has the external terminal T5 for receiving the inductor current detection voltage VL from outside.

Next, the basic operation (voltage step-up operation) of the switching power supply device 1 configured as described above will be described briefly. When the output transistor M1 is turned ON, an inductor current IL passes through the output inductor L2 to the ground terminal via the output transistor M1, causing the electrical energy of the inductor current IL to be stored in the output inductor L2. At this time, a switching voltage Vsw that appears at the drain of the output transistor M1 falls to approximately the ground potential, and thus the rectification diode D2 is reverse-biased. Accordingly, no backward current passes from the output capacitor C1 toward the output transistor M1.

On the other hand, when the output transistor M1 is turned OFF, a back electromotive force appearing in the output inductor L2 causes the electric charge stored there to be discharged. At this time, the rectification diode D2 is forward-biased, and thus the current that passes through the rectification diode D2 passes via the output terminal of the output voltage Vo into the load Z1, and also passes through the output capacitor C1 to the ground terminal, charging the output capacitor C1. The operation thus far is repeated, so that the output voltage Vo obtained by stepping up the input voltage Vi is supplied to the load Z1.

Figure 8:
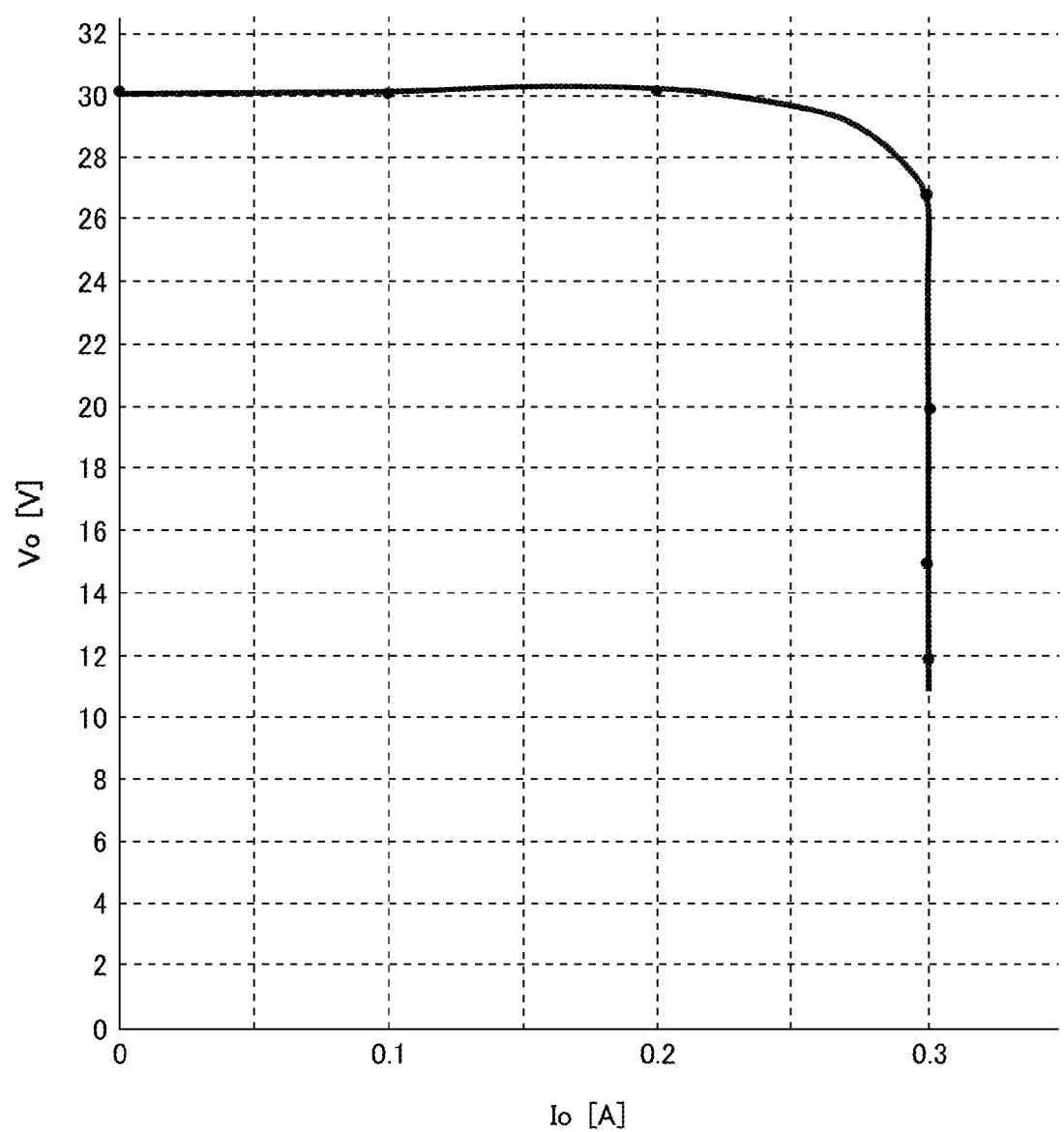
FIG. 8 is an output characteristics diagram of the sixth embodiment.

FIG. 8 is a diagram showing the output characteristics observed when Vi=12 V, L2=47 μH, C1=22 μF, R1=33 kΩ, R2=910Ω, R3=0.1Ω, Rs=2.7Ω, and Vref=0.8 V in the switching power supply device 1 of the sixth embodiment. In the diagram, the horizontal axis represents the output current Io [A], and the vertical axis represents the output voltage Vo [V].

As depicted in FIG. 8, obtained is a constant-current power supply circuit of which the output current Io is constantly 0.3 A (=0.8 V/2.7Ω) so long as the output voltage Vo is in the range of 11 V to 27 V (that is, so long as the load Z1 is in the range of 37Ω to 90Ω). In the illustrated example, the forward voltage drop Vfx across the diode Dx is ignored in calculating the resistance value of the sense resistor Rs; for the target value of the output current Io to be set more accurately, it is necessary to adjust the resistance value of the sense resistor Rs (=(Vref+Vfx)/Io) with the forward voltage drop Vfx across the diode Dx taken into consideration.

On the other hand, in a no-load condition (Io=0 A), constant-voltage control is dominant, and the output voltage Vo is limited to its upper limit value, namely 30 V (=0.8V× [(33 kΩ+910Ω)/910Ω]). The upper limit value of the output voltage Vo can be adjusted arbitrarily by adjusting the resistance value of the voltage division resistor R2.

When the switching power supply device 1 is of a step-up type, adopting a configuration where only the sense voltage Vs is fed to the external terminal T2 (a configuration similar to that of the second embodiment (FIG. 2)) may lead to the output voltage Vo rising abnormally high, possibly causing a fault in the load Z1. This inconvenience, however, does not occur with the configuration of this embodiment where, in a no-load or low-load condition, the output voltage Vo is limited to the upper limit value or lower.

Figure 9:
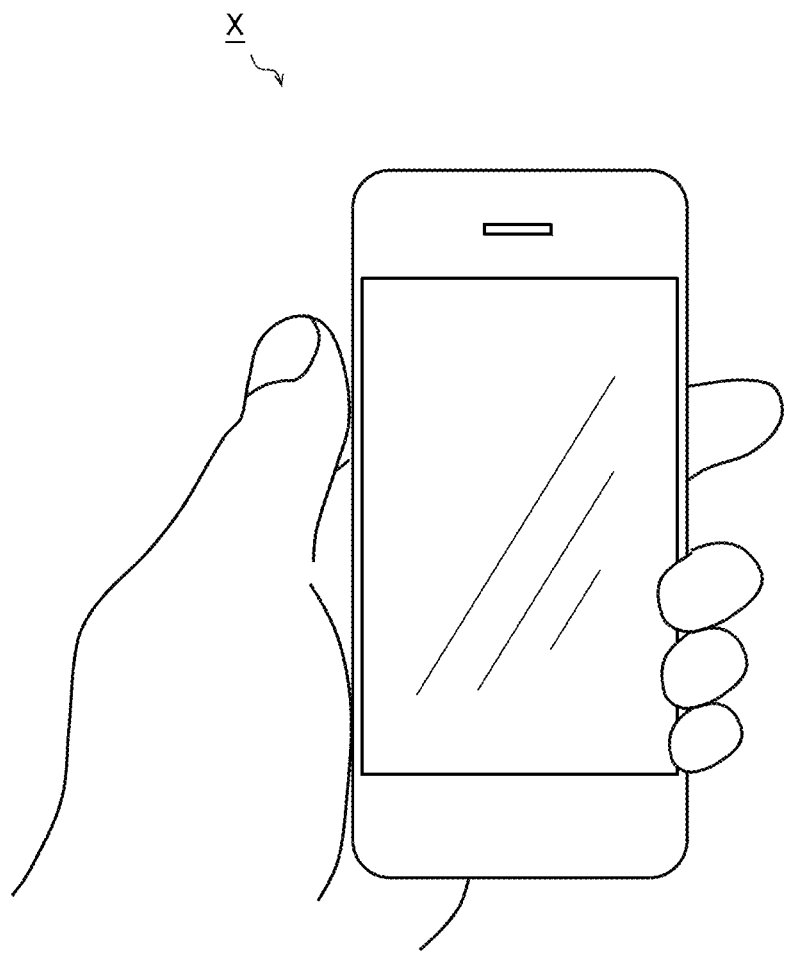
FIG. 9 is an exterior view of a smartphone.

Electronic Appliance:

FIG. 9 is an exterior view of a smartphone. The illustrated smartphone X is one example of an electronic appliance that incorporates a switching power supply device 1 and a load Z1 as described above. For example, when an LED backlight or a battery in the smartphone X is taken as the load Z1, as a means for supplying it with electric power, the switching power supply device 1 described above can be used suitably.

Needless to say, the switching power supply device proposed herein finds wide application in a variety of electronic appliances not limited to smartphones like the one mentioned above.

Other Modifications:

Various technical features disclosed herein can be implemented in any manner other than specifically described above, and allow for many modifications within the spirit of the technical ingenuity involved. For example, any bipolar transistor may be replaced with a MOS field-effect transistor and vice versa, and the logic levels of any signal may be inverted.

Although the embodiments described above deal with examples where a PWM driving method is adopted as a method for driving switching by the controller IC, any other method for driving switching may instead be adopted, such as a PFM driving method (such as a constant ON-period method, a constant OFF-period method, or a window comparator method).

The output type of the switching output stage is not limited to a step-down type (the first to fifth embodiments) or a step-up type (the sixth embodiment), but may instead be a step-up/down type.

The rectification method in the switching output stage is not limited to a diode rectification method as in the embodiments described above, but may instead be a synchronous rectification method. In a case where a synchronous rectification method is adopted, the rectification diode can be replaced with a synchronous rectification transistor and the output transistor and the synchronous rectification transistor can be turned ON and OFF complementarily. Here, the term "complementarily" covers not only operation where the ON and OFF states of the output transistor and the synchronous rectification transistor are completely reversed but also operation where a period (dead time) in which the two transistors are simultaneously OFF is provided.

Thus, the embodiments described above should be considered in every aspect illustrative and not restrictive, and it should be understood that the technical scope of the invention disclosed herein is defined not by the description of embodiments given above but by the appended claims and encompasses any modifications made in the scope and sense equivalent to those of the claims.

Figure 10:
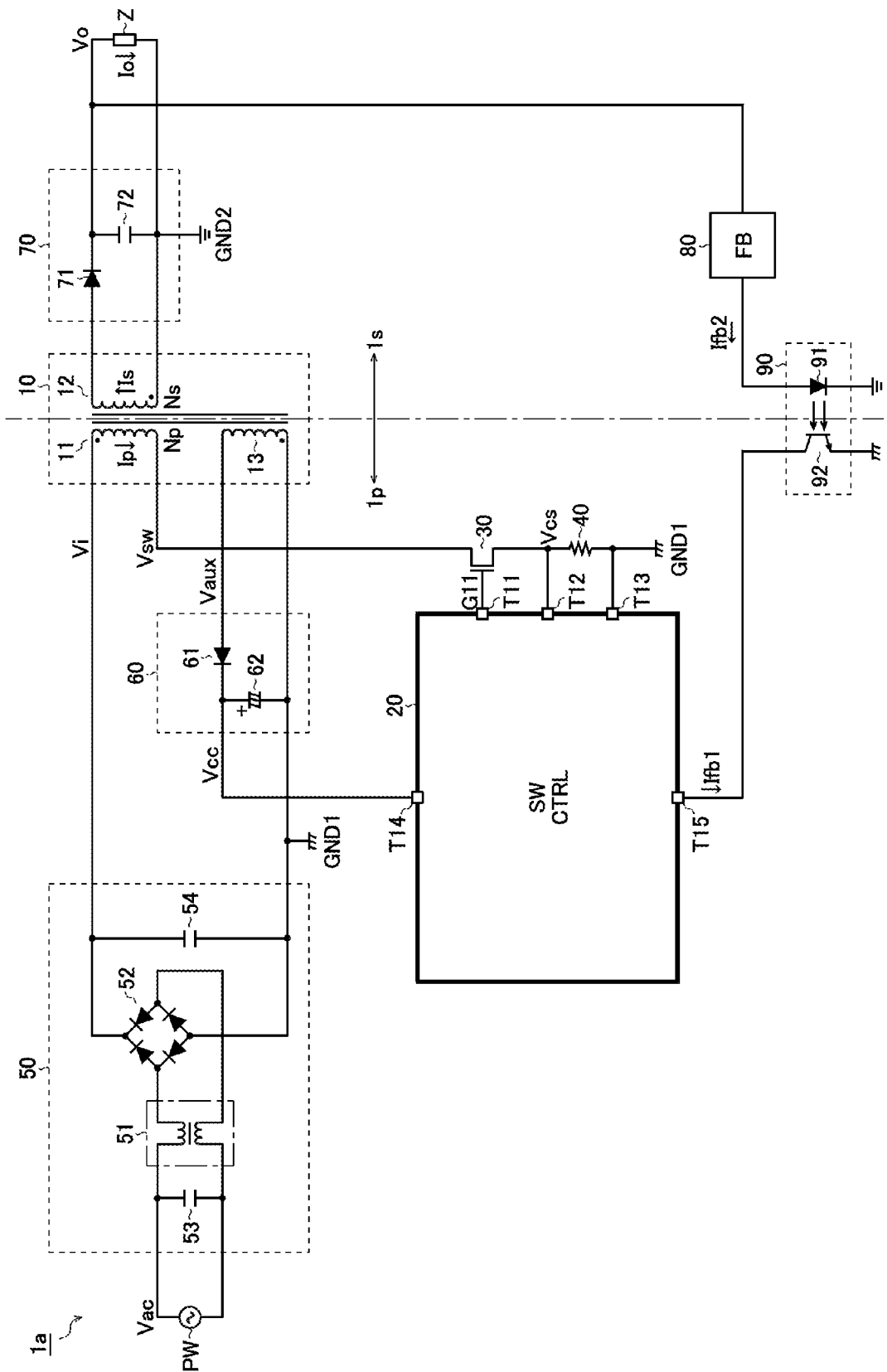
FIG. 10 is a circuit block diagram showing an overall configuration of an isolated switching power supply device.

Isolated Switching Power Supply Device:

FIG. 10 is a block diagram showing an overall configuration of an isolated switching power supply device. The isolated switching power supply device 1a of this configuration example is an isolated AC-DC converter of a flyback type that converts an alternating-current voltage Vac supplied from a commercial alternating-current power source PW into a direct-current output voltage Vo to supply it to a load Z while electrically isolating between a primary circuit system 1p (GND1 system) and a secondary circuit system 1s (GND2 system). The isolated switching power supply device 1a includes a transformer 10, a controller IC 20, an output transistor 30, a sense resistor 40, an AC-DC converter 50, a supply voltage generator 60, an output voltage generator 70, an output feedback circuit 80, and a photocoupler 90.

The transformer 10 has a primary winding 11 (with Np turns) and a secondary winding 12 (with Ns turns) that are magnetically coupled together with opposite polarities while electrically isolating between the primary and secondary circuit systems 1p and 1s. The first terminal of the primary winding 11 is connected to the application terminal of an input voltage Vi. The second terminal of the primary winding 11 is connected via the output transistor 30 and the sense resistor 40 to the ground terminal GND1 of the primary circuit system 1p. The first terminal of the secondary winding 12 is connected via the output voltage generator 70 to the application terminal of the output voltage Vo (that is, the high-potential terminal of the load Z). The second terminal of the secondary winding 12 is connected to the ground terminal GND2 of the secondary circuit system 1s. The numbers of turns Np and Ns can be adjusted arbitrarily so that a desired output voltage Vo is obtained. For example, the larger the number of turns Np or the smaller the number of turns Ns, the lower the output voltage Vo; reversely, the smaller the number of turns Np or the larger the number of turns Ns, the higher the output voltage Vo. The transformer 10 has, in addition to the primary and secondary windings 11 and 12, an auxiliary winding 13. The auxiliary winding 13 is used to generate a supply voltage Vcc for the controller IC 20.

The controller IC 20 is a monolithic semiconductor integrated circuit device that is provided in the primary circuit system 1p, and is the principal component that drives the transformer 10. The controller IC 20 generates a gate signal G11 for the output transistor 30 according to a feedback current Ifb1 and a sense voltage Vcs. The controller IC 20 has, as means for establishing electrical connection with outside the device, external terminals T11 to T15. In FIG. 10, only five representative external terminals T11 to T15 are shown: an external terminal (gate driving terminal) T11 to which the gate of the output transistor 30 is connected; an external terminal (primary current detection terminal) T12 to which the sense voltage Vcs is applied; an external terminal (ground terminal) T13 to which the ground terminal GND1 is connected; an external terminal (power terminal) T14 to which the supply voltage Vcc is applied; and an external terminal (output feedback terminal) T15 through which the feedback current Ifb1 is passed. Any external terminals other than those mentioned above may be additionally provided.

The output transistor 30 is a switching device that is provided in the primary circuit system 1p. The output transistor 30 turns ON and OFF a primary current Ip that passes in the primary winding 11 by switching, according to the gate signal G1, the current path leading from the application terminal of the input voltage Vi via the primary winding 11 to the ground terminal GND1 between a conducting and a cut-off state. In this configuration example, as the output transistor 30, a high-withstand-voltage N-channel MOS (metal-oxide-semiconductor) field-effect transistor is used. The interconnection around it as follows. The drain of the output transistor 30 is connected to the second terminal of the primary winding 11. The source of the output transistor 30 is connected via the sense resistor 40 to the ground terminal GND1. The gate of the output transistor 30 is connected to the external terminal T11 (that is, the application terminal of the gate signal G11). The output transistor 30 is ON when the gate signal G11 is at HIGH level, and is OFF when the gate signal G11 is at LOW level.

The sense resistor 40 (with a resistance value R40) is connected between the source of the output transistor 30 and the ground terminal GND1, and generates the sense voltage Vcs (=Ip×R40) that is commensurate with the primary current Ip.

The AC-DC converter 50 is provided in the primary circuit system 1p, and generates the direct-current (pulsating-current) input voltage Vi from the alternating-current voltage Vac. For example, the AC-DC converter 50 includes a common-mode filter 51, a diode bridge 52, and capacitors 53 and 54. The common-mode filter 51 eliminates common-mode noise in the alternating-current voltage Vac. The diode bridge 52 generates the input voltage Vi through full-wave rectification of the alternating-current voltage Vac. The capacitor 53 eliminates harmonic noise in the alternating-current voltage Vac. The capacitor 54 smooths the input voltage Vi. The AC-DC converter 50 may further include a protection device such as a fuse.

In a case where the isolated switching power supply device 1a is supplied with a direct-current input voltage Vi, the AC-DC converter 50 can be omitted. In that case, the isolated switching power supply device 1a can be understood as an insulated DC-DC converter of a flyback type.

The supply voltage generator 60 is a rectification-smoothing circuit that is provided in the primary circuit system 1p, and includes a rectification diode 61 and a smoothing capacitor 62. The interconnection around them is as follows. The anode of the diode 61 is connected to the first terminal of the auxiliary winding 13. The cathode of the diode 61 and the first terminal of the capacitor 62 are both connected to the external terminal T14 of the controller IC 20. The second terminal of the capacitor 62 is connected to the ground terminal GND1. Configured as described above, the supply voltage generator 60 rectifies and smooths an induced voltage Vaux that appears in the auxiliary winding 13, thereby generates the supply voltage Vcc for the controller IC 20, and applies it to the external terminal T14 of the controller IC 20. The winding ratio between the primary winding 11 and the auxiliary winding 13 can be set as desired with consideration given to the supply voltage Vcc that is required for the controller IC 20 to operate.

The output voltage generator 70 is a rectification-smoothing circuit provided in the secondary circuit system 1s, and includes a rectification diode 71 and a smoothing capacitor 72. The interconnection around them is as follows. The anode of the rectification diode 71 is connected to the first terminal of the secondary winding 12. The cathode of the rectification diode 71 and the first terminal of the smoothing capacitor 72 are both connected to the application terminal of the output voltage Vo. The second terminal of the smoothing capacitor 72 is connected to the ground terminal GND2. Configured as described above, the output voltage generator 70 rectifies and smooths an induced voltage that appears in the secondary winding 12, and thereby generates the output voltage Vo.

The output feedback circuit 80 is provided in the secondary circuit system 1s, and generates a secondary-side feedback current Ifb2 that is commensurate with the output voltage Vo or the output current Io to feed the secondary-side feedback current Ifb2 to the photocoupler 90. The internal configuration and operation of the output feedback circuit 80 will be described in detail later.

The photocoupler 90 includes a light-emitting diode 91 provided in the secondary circuit system 1s and a phototransistor 92 provided in the primary circuit system 1p, and transmits a signal from the secondary circuit system 1s to the primary circuit system 1p while electrically isolating between the primary and secondary circuit systems 1p and 1s. More specifically, the photocoupler 90 makes the light-emitting diode 91 emit light at the luminance commensurate with the feedback current Ifb2 and thereby converts the feedback current Ifb2 into an optical signal, and then detects the optical signal with the phototransistor 92 to convert it back to the primary-side feedback current Ifb1. Accordingly, the feedback current Ifb1 varies with behavior similar to that of the feedback current Ifb2.

In the isolated switching power supply device 1a configured as described above, the transformer 10, the output transistor 30, and the output voltage generator 70 function as a switching output stage that receives electric power from the primary circuit system 1p and supplies the output voltage Vo and the output current Io to the load Z provided in the secondary circuit system 1s while electrically isolating between the primary and secondary circuit systems 1p and 1s.

Basic Operation:

Next, the basic operation of the isolated switching power supply device 1a configured as described above will be described briefly. When the gate signal G11 rises to HIGH level, the output transistor 30 turns ON. During the ON period of the output transistor 30, a primary current Ip passes from the application terminal of the input voltage Vi via the primary winding 11, the output transistor 30, and the sense resistor 40 to the ground terminal GND1, causing electrical energy to be stored in the primary winding 11.

Thereafter, when the gate signal G11 falls to LOW level, the output transistor 30 turns OFF. During the OFF period of the output transistor 30, an induced voltage appears in the secondary winding 12, which is magnetically coupled with the primary winding 11, and a secondary current Is passes from the secondary winding 12 via the rectification diode 71 to the ground terminal GND2. At this time, the output voltage Vo obtained through half-wave rectification of the induced voltage in the secondary winding 12 is supplied to the output voltage Vo.

Thereafter, the gate signal G11 is pulse-driven at a predetermined switching frequency fsw, so that switching operation similar to that described above is repeated.

As described above, with the isolated switching power supply device 1a of this configuration example, it is possible to generate from an alternating-current voltage Vac an output voltage Vo and supply it to a load Z while electrically isolating between a primary circuit system 1p and a secondary circuit system 1s.

Figure 11:
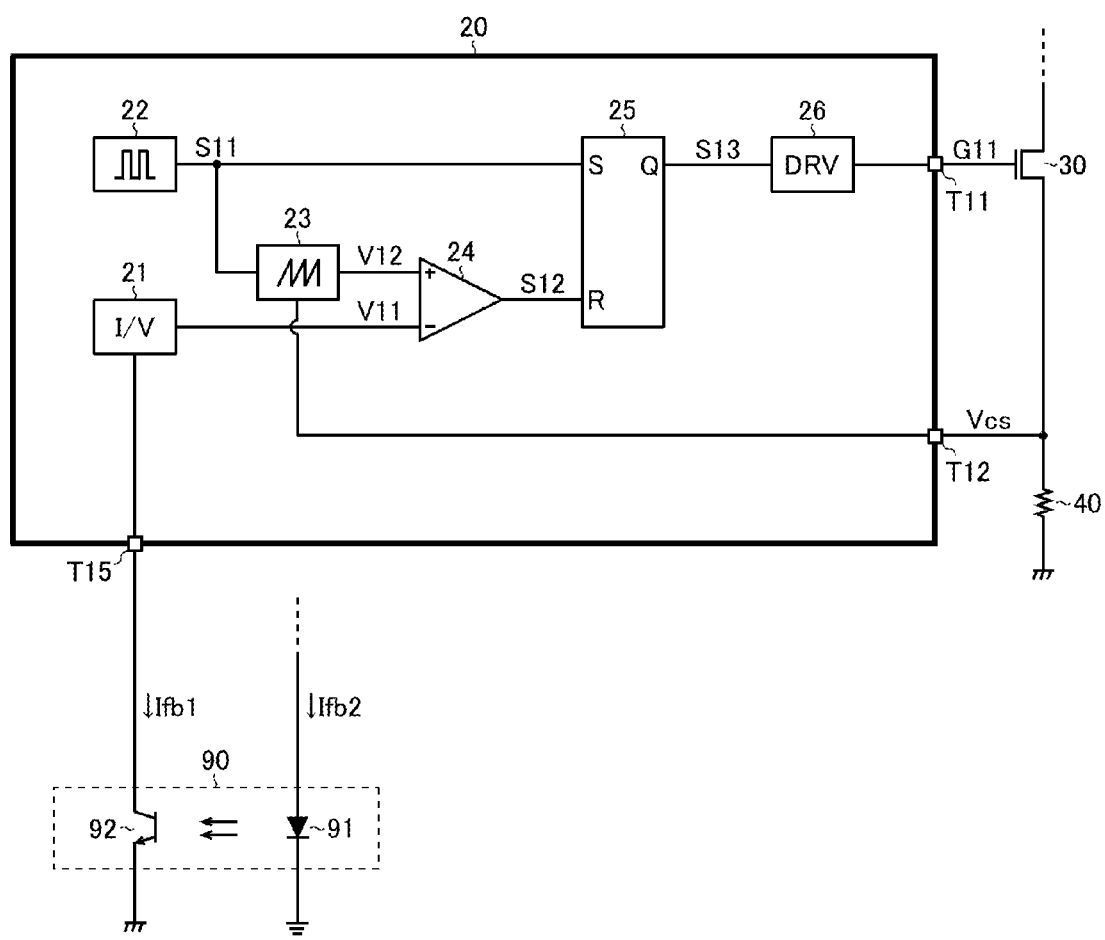
FIG. 11 is a block diagram showing one configuration example of a controller IC.

Controller IC:

FIG. 11 is a block diagram showing one configuration example of the controller IC 20. The controller IC 20 of this configuration example has integrated into it a current-voltage conversion circuit 21, a clock signal generation circuit 22, a slope voltage generation circuit 23, a PWM (pulse-width modulation) comparator 24, a logic circuit 25, and a gate driving circuit 26.

In addition to the above-mentioned circuit elements, the controller IC 20 may further incorporate, as necessary, various protection circuits (such as a low-input malfunction prevention circuit, a temperature protection circuit, an over-current protection circuit, and an overvoltage protection circuit).

The current-voltage conversion circuit 21 generates a feedback voltage V11 that is commensurate with the feedback current Ifb1 which passes through the external terminal T15. For example, the feedback voltage V11 is lower the higher the feedback current Ifb1 is, and is higher the lower the feedback current Ifb1 is. In one of the simplest circuit configurations to achieve that operation, for example, a resistor (with a resistance value R) is connected between the application terminal of a constant voltage Vreg and the external terminal T15, and the terminal voltage (=Vreg−Ifb1×R) that appears at the external terminal T15 can be used as the feedback voltage V11.

The clock signal generation circuit 22 generates a clock signal S11 with a square waveform that is pulse-driven at a predetermined switching frequency fsw.

The slope voltage generation circuit 23 generates a slope voltage V12 with a triangular waveform, a saw-tooth waveform, or an n-th order slope waveform (where, for example, n=2) in synchronism with the clock signal S11. The slope voltage generation circuit 23 also has the function of giving an offset to the slope voltage V12 in accordance with a sense voltage Vcs (which is a voltage signal that simulates the behavior of the primary current Ip) that is fed to the external terminal T12. Owing to the provision of this offsetting function, output feedback control is achieved by current mode control, and this helps enhance the stability of the output feedback loop and improve the transient response against variation of load. However, in a case where output feedback control by voltage mode control suffices, the sense resistor 40 and the external terminal T12 may be omitted so that the controller IC 200 has a simpler circuit configuration.

The PWM comparator 24 generates a comparison signal S12 by comparing the feedback voltage V11, which is fed to the inverting input terminal (−) of the PWM comparator 24, with the slope voltage V12, which is fed to the non-inverting input terminal (+) of the PWM comparator 24. The comparison signal S12 is at LOW level when the slope voltage V12 is lower than the feedback voltage V11, and is at HIGH level when the slope voltage V12 is higher than the feedback voltage V11.

The logic circuit 25 is an RS flip-flop that generates a PWM signal S13 according to the clock signal S11, which is fed to the set terminal (S) of the logic circuit 25, and the comparison signal S12, which is fed to the reset terminal (R) of the logic circuit 25. The PWM signal S13 is set to HIGH level at a pulse edge in the clock signal S11, and is reset to LOW level at a pulse edge in the comparison signal S12.

The gate driving circuit 26 generates a gate signal G11 in response to the PWM signal S13. The gate signal G11 is at LOW level when the PWM signal S13 is at HIGH level, and is at HIGH level when the PWM signal S13 is at LOW level.

Figure 12:
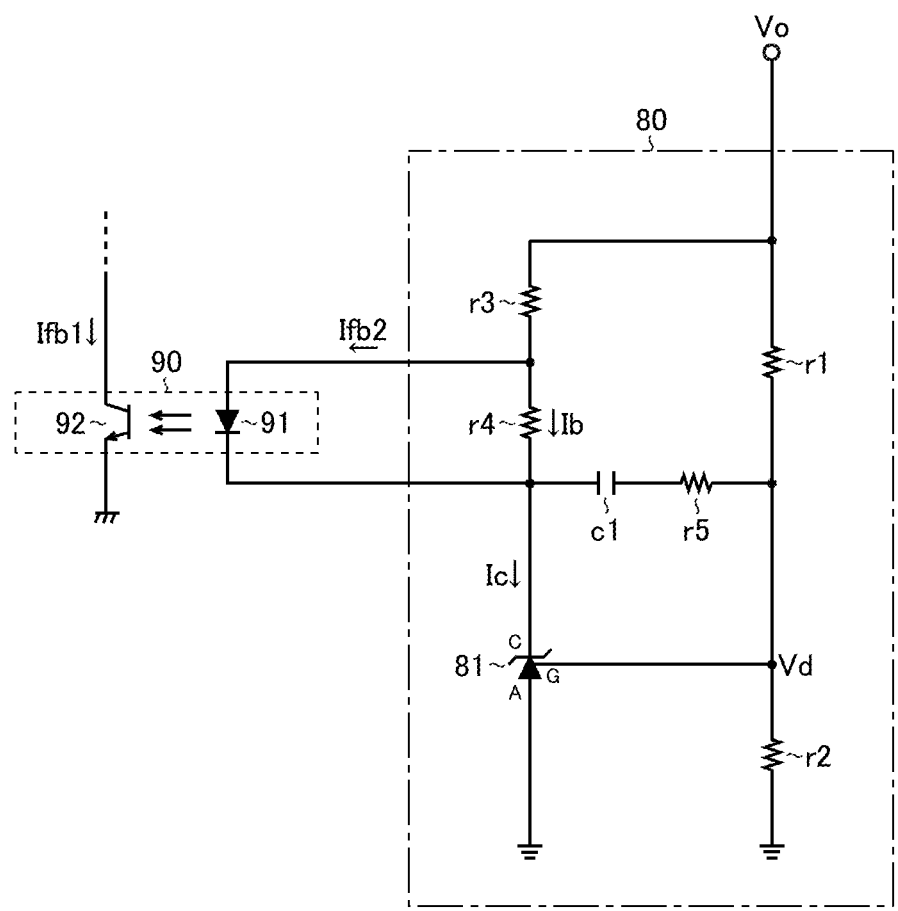
FIG. 12 is a circuit diagram showing a first practical example of an output feedback circuit.

Output Feedback Circuit (First Practical Example):

FIG. 12 is a circuit diagram showing a first practical example of the output feedback circuit 80. The output feedback circuit 80 of this practical example includes a shunt regulator 81, resistors r1 to r5, and a capacitor c1.

The cathode C of the shunt regulator 81 is connected to the cathode of the light-emitting diode 91. The anode A of the shunt regulator 81 is connected to the ground terminal GND2. The resistor r1 is connected between the output terminal of the output voltage Vo and the gate G (corresponding to a control terminal) of the shunt regulator 81. The resistor r2 is connected between the gate G of the shunt regulator 81 and the ground terminal GND2. The resistor r3 is connected between the output terminal of the output voltage Vo and the anode of the light-emitting diode 91. The resistor r4 is connected between the anode and cathode of the light-emitting diode 91. The resistor r5 and the capacitor c1 are connected in series between the gate G and cathode C of the shunt regulator 81.

In the output feedback circuit 80 configured as described above, the resistors r1 and r2, which are connected in series between the output terminal of the output voltage Vo and the ground terminal GND2, function as a voltage division circuit that outputs, from the connection node between the resistors r1 and r2, a division voltage Vd (=Vo×[r2/(r1+r2)]) of the output voltage Vo.

The resistor r3 is provided to limit the feedback current Ifb2 that passes through the light-emitting diode 91. The resistor r3 can be given a resistance value of, for example, 1 kΩ to 2 kΩ.

The resistor r4 is provided to keep a minimum bias current Ib in the shunt regulator 81. The resistor r4 can be given a resistance value of, for example, 1 kΩ(=Vf/Ib=1 V/1 mA) with consideration given to the set value (for example, 1 mA) of the bias current Ib and the forward voltage drop Vf (for example, 1 V) across the light-emitting diode 91.

The resistor r5 and the capacitor c1 are provided as a phase compensation circuit in an output feedback loop. For example, the resistor r5 can be given a resistance value of 10 kΩ to 30 kΩ, and the capacitor c1 can be given a capacitance value of 0.1 μF.

The shunt regulator 81 controls the cathode current Ic that passes through the cathode C (and hence the feedback current Ifb2 that passes through the light-emitting diode 91) according to the division voltage Vd which is applied to the gate G.

Figure 13:
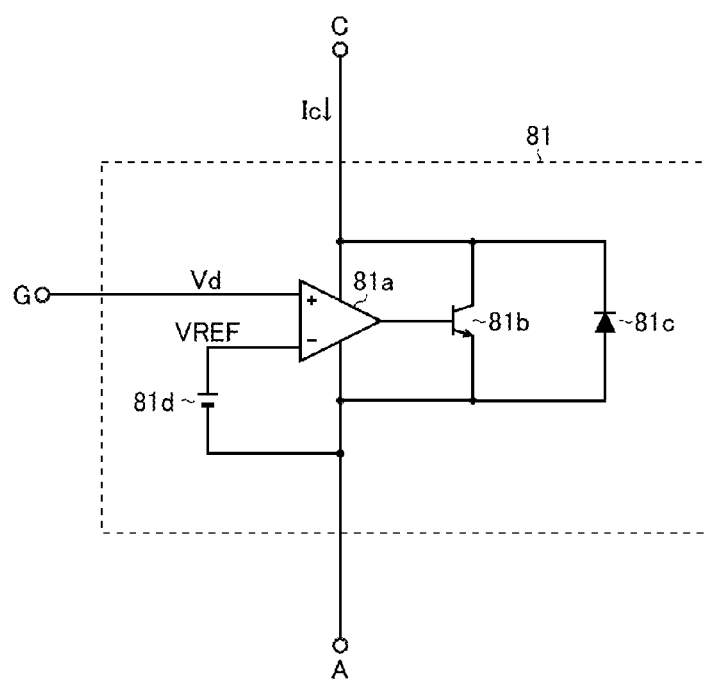
FIG. 13 is a circuit diagram showing one configuration example of a shunt regulator.

FIG. 13 is a circuit diagram showing one configuration example of the shunt regulator 81. The shunt regulator 81 of this configuration example includes an operational amplifier 81a, an NPN bipolar transistor 81b, a diode 81c, and a voltage source 81d.

The first power terminal (high-potential side) of the operational amplifier 81a corresponds to the cathode C of the shunt regulator 81. The second power terminal (low-potential side) of the operational amplifier 81a corresponds to the anode A of the shunt regulator 81. The non-inverting input terminal (+) of the operational amplifier 81a corresponds to the gate G of the shunt regulator 81.

The collector of the transistor 81b is connected to the first power terminal of the operational amplifier 81a. The emitter of the transistor 81b is connected to the second power terminal of the operational amplifier 81a. The base of the transistor 81b is connected to the output terminal of the operational amplifier 81a.

The cathode of the diode 81c is connected to the first power terminal of the operational amplifier 81a. The anode of the diode 81c is connected to the second power terminal of the operational amplifier 81a.

The positive terminal of the voltage source 81d is connected to the inverting input terminal (−) of the operational amplifier 81a. The negative terminal of the voltage source 81d is connected to the second power terminal of the operational amplifier 81a.

In the shunt regulator 81 configured as described above, the operational amplifier 81a controls the degree of conduction of the transistor 81b so as to achieve an imaginary short circuit between the division voltage Vd that is fed to the gate G of the shunt regulator 81 and an internal reference voltage VREF (for example, 2.495 V) that is generated in the voltage source 81d. Accordingly, the collector current of the transistor 81b (and hence the cathode current Ic of the shunt regulator 81) increases when Vd>VREF, and decreases when Vd<VREF.

Thus, when Vd>VREF, the cathode current Ic of the shunt regulator 81 increases, and the feedback current Ifb2 that passes through the light-emitting diode 91 increases. Accordingly, the feedback current Ifb1 that passes through the phototransistor 92 increases, and thus the feedback voltage V11 generated in the controller IC 20 falls, causing the feedback voltage V11 and the slope voltage V12 to cross each other with advanced timing. As a result, the comparison signal S2 rises with advanced timing, making the ON-period of the output feedback circuit 80 shorter, and thus the output voltage Vo falls.

By contrast, when Vd<VREF, the cathode current Ic of the shunt regulator 81 decreases, and the feedback current Ifb2 that passes through the light-emitting diode 91 decreases. Accordingly, the feedback current Ifb1 that passes through the phototransistor 92 decreases, and thus the feedback voltage V11 generated in the controller IC 20 rises, causing the feedback voltage V11 and the slope voltage V12 to cross each other with delayed timing. As a result, the comparison signal S2 rises with delayed timing, making the ON-period of the output feedback circuit 80 longer, and thus the output voltage Vo rises.

Through the output feedback operation described above, the output voltage Vo is kept at a predetermined target value (=VREF×[(r1+r2)/r2]). Thus, when the output feedback circuit 80 of the first practical example is used, the isolated switching power supply device 1a functions as a constant-voltage power supply circuit.

Figure 14:
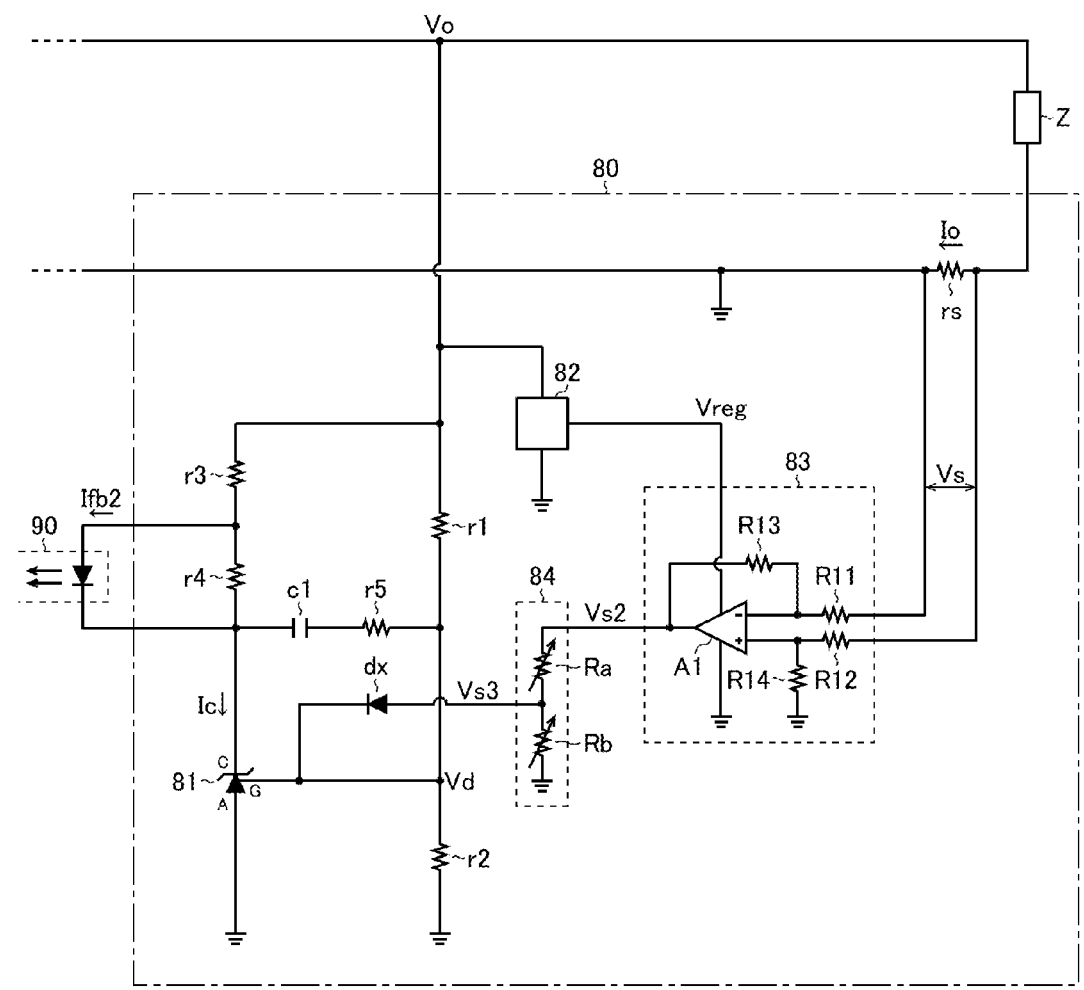
FIG. 14 is a circuit diagram showing a second practical example of an output feedback circuit.

Output Feedback Circuit (Second Practical Example):

FIG. 14 is a circuit diagram showing a second practical example of the output feedback circuit 80. The output feedback circuit 80 of this practical example is based on the first practical example but additionally includes a few more circuit elements to permit the isolated switching power supply device 1a to function not only as a constant-voltage power supply circuit but also as a constant-current power supply circuit. Accordingly, such elements as find their counterparts in the first practical example are identified by the same reference signs as in FIG. 12 and no overlapping description will be repeated; the following description thus focuses on features unique to this practical example.

The output feedback circuit 80 of this practical example includes, in addition to the shunt regulator 81 and the discrete components (the resistors r1 to r5 and the capacitor c1) mentioned above, a sense resistor rs, a constant voltage generation circuit 82, an amplification circuit 83, a voltage division circuit 84, and a diode dx.

The sense resistor rs is connected between the low-potential terminal of the load Z and the ground terminal GND2, and converts the output current Io that passes from the load Z to the ground terminal GND2 into the sense voltage Vs. Here, the sense voltage Vs is a voltage signal (=Io×rs) that is proportional to the output current Io. For example, when Io=1 A and rs=0.1Ω, then Vs=0.1 V.

The constant voltage generation circuit 82 is a power supply circuit that generates the desired constant voltage Vreg (for example, 5 V) from the output voltage Vo, and as the constant voltage generation circuit 82, for example, a three-terminal regulator IC can be used suitably.

The amplification circuit 83 is a circuit that amplifies the sense voltage Vs at a gain α(>1) to generate an amplified sense voltage Vs2 (=α×Vs2), and includes an operational amplifier A1 and resistors R11 to R14. The first power terminal (high-potential side) of the operational amplifier A1 is connected to the application terminal of the constant voltage Vreg (that is, the output terminal of the constant voltage generation circuit 82). The second power terminal (low-potential side) of the operational amplifier A1 is connected to the ground terminal GND2. The resistor R11 is connected between the inverting input terminal (−) of the operational amplifier A1 and the low-potential terminal of the sense resistor rs. The resistor R12 is connected between the non-inverting input terminal (+) of the operational amplifier A1 and the high-potential terminal of the sense resistor rs. The resistor R13 is connected between the inverting input terminal (−) and output terminal of the operational amplifier A1. The resistor R14 is connected between the non-inverting input terminal (+) of the operational amplifier A1 and the ground terminal GND2.

Owing to the provision of the amplification circuit 83 described above, even if the sense voltage Vs is a very low voltage relative to the internal reference voltage VREF in the shunt regulator 81, it can be amplified appropriately so as to be adapted to the gate input range of the shunt regulator 81.

For example, setting R11=R12=10 kΩ and R13=R14=300 kΩ gives α=30 (=R13/R11). Thus, a sense voltage Vs of about 0.1 V can be raised to about 3 V, and it can then be used for comparison with the internal reference voltage VREF (=2.495 V).

Theoretically, it is also possible to give the sense resistor rs a higher resistance value so that the sense voltage Vs itself is higher; it is then possible to omit the amplification circuit 83. However, in a case where the output current Io is high, caution needs to be exercised against possibly problematic power loss and heat production.

The voltage division circuit 84 is a circuit block that divides the amplified sense voltage Vs2 at an arbitrary division rate β(<1) to generate a divided sense voltage Vs3 (=β×Vs2), and includes variable resistors Ra and Rb. The variable resistors Ra and Rb are connected in series between the application terminal of the amplified sense voltage Vs2 (that is, the output terminal of the amplification circuit 83) and the ground terminal GND2, and output, from the connection node between the variable resistors Ra and Rb, the divided sense voltage Vs3 (=Vs2×[Rb/(Ra+Rb)]).

Owing to the provision of the voltage division circuit 84 described above, by giving the variable resistors Ra and Rb arbitrary resistance values, it is possible to fine-adjust the voltage value of the divided sense voltage Vs3. However, the voltage division circuit 84 is not an essential element; for example, where the amplification circuit 83 is configured to allow its gain α to be set freely, the voltage division circuit 84 may be omitted.

The anode of the diode dx is connected to the application terminal of the divided sense voltage Vs3 (that is, the output terminal of the voltage division circuit 84). The cathode of the diode dx is connected to the gate G of the shunt regulator 81.

Thus, in the output feedback circuit 80 of this practical example, dominant as the control voltage that is applied to the gate G of the shunt regulator 81 is whichever is higher of the division voltage Vd, which is commensurate with the output voltage Vo, and the divided sense voltage Vs3 (more precisely, Vs3−Vfx, where Vfx is the forward division voltage Vd across the diode dx), which is commensurate with the output current Io.

For example, in a high-load condition where the output current Io is higher than a predetermined value (=(Vd+Vfx)/(rs×α×β)), the divided sense voltage (Vs3−Vfx) is higher than the division voltage Vd. Accordingly, in the shunt regulator 81, the generation of the cathode current Ic is controlled such that the divided sense voltage (Vs3−Vfx) remains equal to the internal reference voltage VREF. As a result, the isolated switching power supply device 1a operates as a constant-current power supply circuit, and thus the output current Io is kept at the target value (=(VREF+Vfx)/(rs×α×β)).

On the other hand, in a no-load or low-load condition where the output current Io is lower than the above-mentioned predetermined value (=(Vd+Vfx)/(rs×α×β)), the division voltage Vd is higher than the divided sense voltage (Vs3−Vfx). Accordingly, in the shunt regulator 81, the generation of the cathode current Ic is controlled such that the division voltage Vd remains equal to the internal reference voltage VREF. As a result, the isolated switching power supply device 1a operates as a constant-voltage power supply circuit, and thus the output voltage Vo is kept at the target value (=VREF×[(r1+r2)/r2]).

In a no-load or low-load condition as mentioned above, the diode dx is reverse-biased; thus, no current passes from the application terminal of the division voltage Vd to the application terminal of the divided sense voltage Vs3.

As described above, with the isolated switching power supply device 1a incorporating the output feedback circuit 80 of this practical example, by use of a controller IC 20 that has only a single output feedback terminal (the external terminal T15), it is possible to achieve both constant-current control and constant-voltage control.

In particular, with the output feedback circuit 80 of this practical example, even in a no-load or low-load condition, the output voltage Vo does not rise beyond a predetermined upper limit value (=VREF×[(r1+r2)/r2]), and this helps alleviate an adverse effect on the load Z1.

In a case where what is connected as the load Z1 requires constant-current control, such as a current-driven light-emitting device (for example, an LED device) or a battery, adopting this embodiment is very effective from the viewpoints of enhancing efficiency and improving safety, and an increasingly wide range of application is expected in the future.

Figure 15:
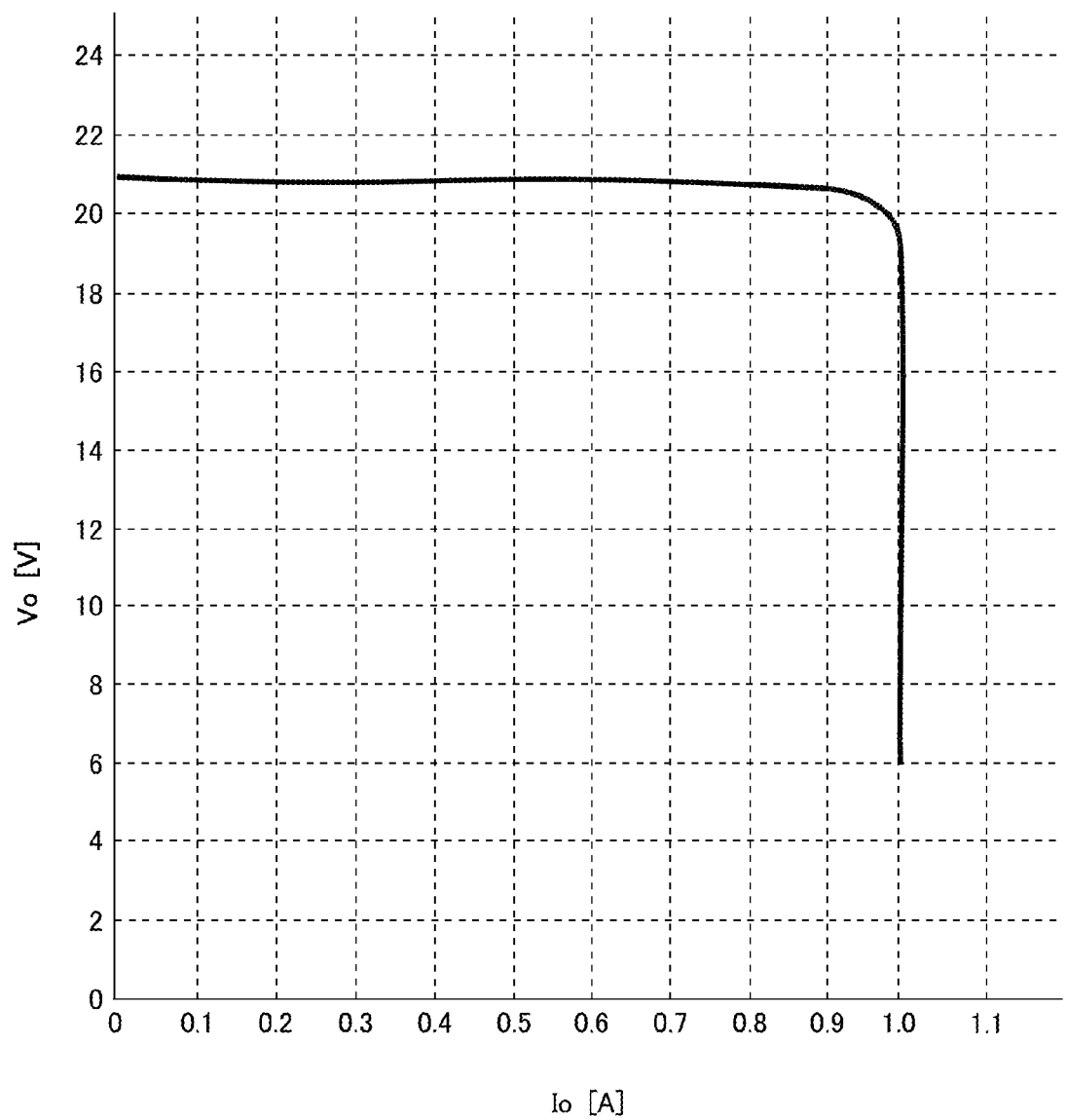
FIG. 15 is an output characteristics diagram of the second practical example.

FIG. 15 is a diagram showing the output characteristics observed in the isolated switching power supply device 1a incorporating the output feedback circuit 80 of the second practical example when the target value of the output current Io is set at 1 A (for example, when R11=R12=10 kΩ, R13=R14=300 kΩ, Ra=510Ω, Rb=2.7 kΩ, rs=0.1Ω, and VREF=2.495V). In the diagram, the horizontal axis represents the output current Io [A], and the vertical axis represents the output voltage Vo [V].

As depicted in FIG. 15, obtained is a constant-current power supply circuit of which the output current Io is constantly 1 A so long as the output voltage Vo is in the range of 6 V to 20 V. In the diagram, it is also depicted how the protection circuit operates to cut the output current Io when the output voltage Vo falls to 5 V or less.

Figure 16:
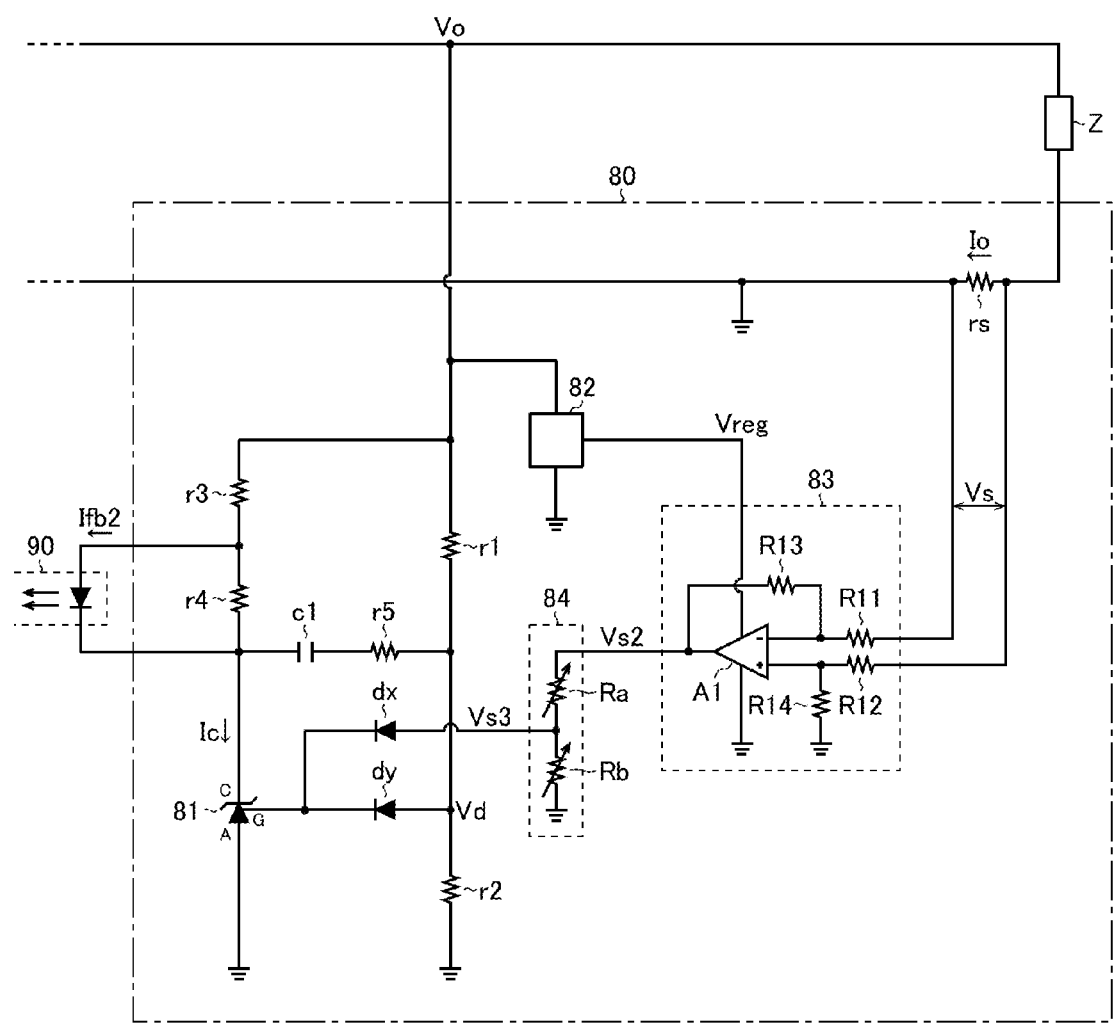
FIG. 16 is a circuit diagram showing a third practical example of an output feedback circuit.

Output Feedback Circuit (Third Practical Example):

FIG. 16 is a circuit diagram showing a third practical example of the output feedback circuit 80. The output feedback circuit 80 of this practical example is based on the second practical example described previously and is characterized by additionally including a diode dy. Accordingly, such elements as find their counterparts in the second practical example are identified by the same reference signs as in FIG. 14 and no overlapping description will be repeated; the following description thus focuses on features unique to this practical example.

The anode of the diode dy is connected to the connection node between the resistors r1 and r2 (that is, the application terminal of the division voltage Vd). The cathode of the diode dy is connected to the gate G of the shunt regulator 81. With this configuration, constant-current control and constant-voltage control are switched according to the result of comparison of the division voltage (Vd−Vfy, where Vfy is the forward voltage drop across the diode dy) with the sense voltage (Vs3−Vfx). Accordingly, pairing the diodes dx and dy such that Vfx=Vfy eliminates the need to consider the forward voltage drops Vfx and Vfy in diode OR operation, and this makes it possible to compare the division voltage Vd with the divided sense voltage Vs3 as they are.

The addition of the diode dy adds the term of the forward voltage drop Vfy to the target value of the output voltage Vo under constant-voltage control (making it (VREF+Vfy)×[(r1+r2)/r2]).

Figure 17:
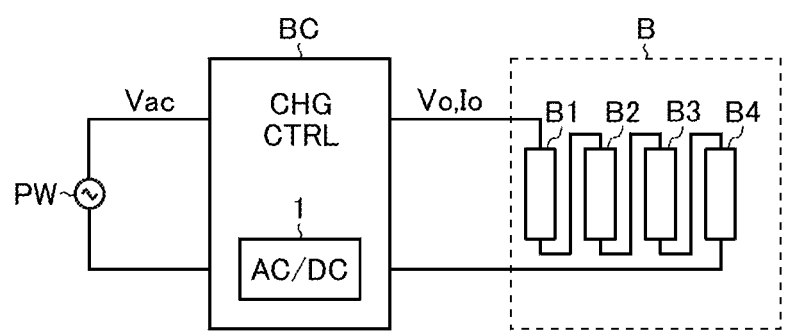
FIG. 17 is a block diagram showing an example of application to a battery charging device.

Battery Charging Device:

FIG. 17 is a block diagram showing an example of application to a battery charging device. The battery charging device BC of this configuration example operates by being supplied with an alternating-current voltage Vac (for example, AC 85 V to 275 V) from a commercial alternating-current power source PW, and controls the charging of a lithium-ion battery B (that is, supply it with an output voltage Vo and an output current Io) by use of the isolated switching power supply device 1a described previously (in particular one adopting as the output feedback circuit 80 the second practical example (FIG. 14) or the third practical example (FIG. 16)).

In the illustrated example, the lithium-ion battery B is composed of four battery cells B1 to B4 that are connected in series. The battery cells B1 to B4 are each used in a voltage range of 3 V to 4.2 V. More specifically, the battery cells B1 to B4 are each subject to a discharge completion voltage of 3 V, and are prohibited from being discharged to below the discharge completion voltage. On the other hand, the battery cells B1 to B4 are each subject to a full charge voltage of 4.2 V, and are prohibited from being charged to above the full charge voltage.

Accordingly, the output voltage Vo that is supplied to the lithium-ion battery B composed of four battery cells B1 to B4 connected in series needs to be controlled within a voltage range of 12 V to 16.8 V.

Figure 18:
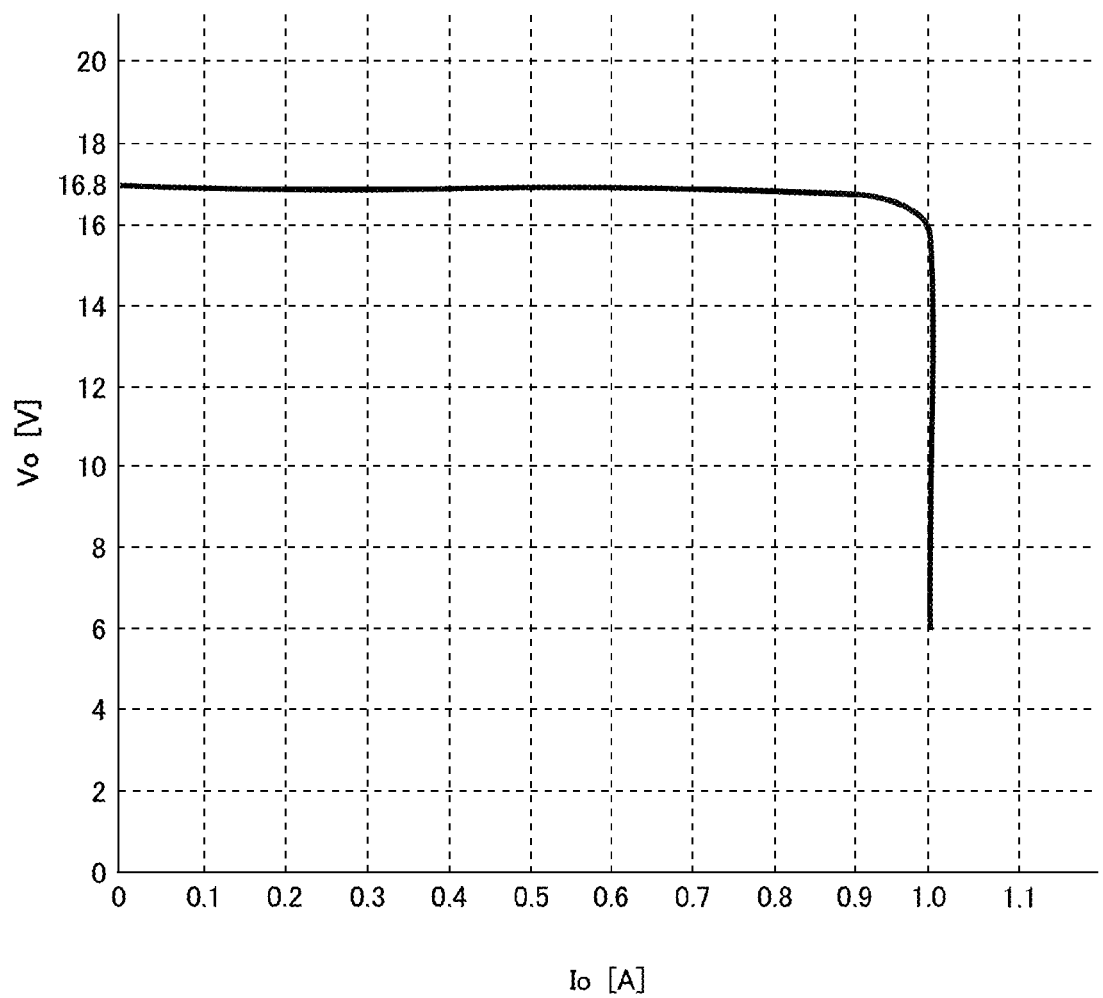
FIG. 18 is an output characteristics diagram of a battery charging device.

FIG. 18 is a diagram showing the output characteristics observed when the target value of the output current Io is set at 1 A and the upper limit value of the output voltage Vo is set at 16.8 V (for example, when R11=R12=10 kΩ, R13=R14=300 kΩ, Ra=510Ω, Rb=2.7 kΩ, rs=0.1Ω, r1=47.125 kΩ, r2=8.2 kΩ, and VREF=2.495 V). In the diagram, the horizontal axis represents the output current Io [A], and the vertical axis represents the output voltage Vo [V].

As shown in FIG. 18, once the upper limit value of the output voltage Vo in a no-load condition is set at 16.8 V, the lithium-ion battery B can be charged with a constant output current Io and, when it is fully charged, the output voltage Vo can be limited to a predetermined upper limit value (=16.8 V) automatically without any additional complicated operation.

In particular, with the isolated switching power supply device 1a incorporating the AC-DC converter 50, it is possible to control the charging of the lithium-ion battery B by using alternating-current electric power that is supplied, and it is thus possible to achieve very high efficiency combined with power saving.

Figure 19A:
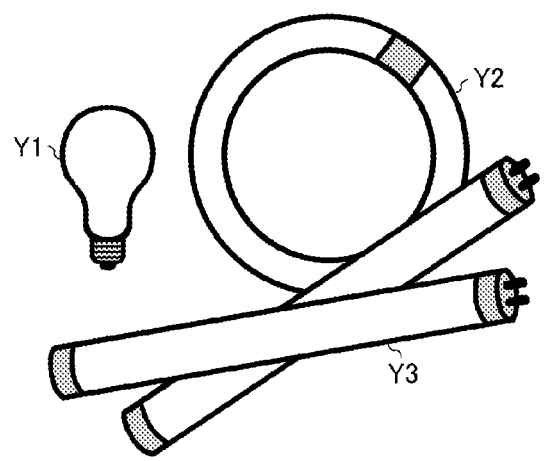
FIG. 19A is an exterior view showing a first example of application to an LED lighting device.
Figure 19B:
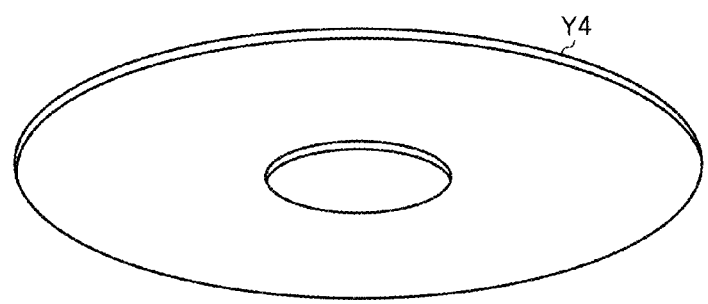
FIG. 19B is an exterior view showing a second example of application to an LED lighting device.
Figure 19C:
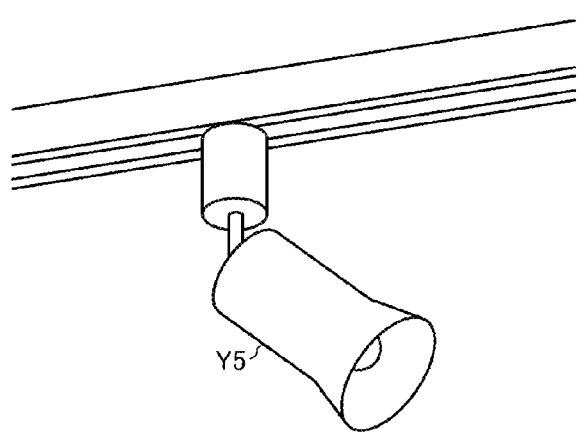
FIG. 19C is an exterior view showing a third example of application to an LED lighting device.

LED Lighting Device:

FIG. 19A to 19C are exterior views of examples of application to different LED lighting devices respectively. FIG. 19 depicts a bulb-form LED lamp Y1, a ring tube-form LED lamp Y2, and straight tube-form LED lamps Y3. FIG. 19B depicts an LED ceiling light Y4, and FIG. 19C depicts a LED down light Y5. It is preferable that these LED lighting devices be provided with a power supply means capable of constant-current control of LEDs by being supplied with alternating-current electric power from a commercial alternating-current power source. Quite suitable as such a power supply means is the isolated switching power supply device 1a described above.

Other Modifications:

The isolated switching power supply device 1a proposed herein finds applications not only in battery charging devices A and various LED lighting devices Y1 to Y5 as mentioned above but widely in electronic appliances in general that incorporate a load requiring constant-current control.

Various technical features disclosed herein can be implemented in any manner other than specifically described above, and allow for many modifications within the spirit of the technical ingenuity involved. For example, any bipolar transistor may be replaced with a MOS field-effect transistor and vice versa, and the logic levels of any signal may be inverted.

For example, although the above embodiment deals with, as an example, an isolated switching power supply device of a flyback type, this is not meant to limit the target of application of the invention disclosed herein; the invention is applicable equally to, for example, an isolated switching power supply device of a forward type.

Although the above embodiment deals with an example where a PWM driving method is adopted as a method for driving switching by the controller IC, any other method for driving switching may instead be adopted, such as a PFM driving method (such as a constant ON-period method, a constant OFF-period method, or a window comparator method).

Thus, the embodiments described above should be considered in every aspect illustrative and not restrictive, and it should be understood that the technical scope of the invention disclosed herein is defined not by the description of embodiments given above but by the appended claims and encompasses any modifications made in the scope and sense equivalent to those of the claims.

INDUSTRIAL APPLICABILITY

The invention disclosed herein finds suitable applications as a power supply means in, for example, such LED lighting devices and battery charging devices as require constant-current control.

What is claimed is:

1. A switching power supply device, comprising:
a switching output stage configured to generate an output voltage from an input voltage and feed the output voltage to a load;
a controller IC configured to control the switching output stage such that a feedback voltage applied to an output feedback terminal of the controller IC remains equal to a predetermined reference voltage;
a first resistor connected between an output terminal of the output voltage and the output feedback terminal;
a second resistor connected between the output feedback terminal and a ground terminal;
a sense resistor configured to convert an output current passing between the load and the ground terminal into a sense voltage; and
a first diode of which an anode is connected to an application terminal of the sense voltage and of which a cathode is connected to the output feedback terminal.

2. The switching power supply device of claim 1, further comprising:
a second diode of which an anode is connected to a connection node between the first and second resistors and of which a cathode is connected to the output feedback terminal.

3. The switching power supply device of claim 1, wherein
the first diode is integrated in the controller IC, and
the controller IC has an external terminal that is connected to the anode of the first diode.

4. The switching power supply device of claim 1, wherein
the switching output stage is of a step-down type, a step-up type, or a step-up/down type.

5. The switching power supply device of claim 1, wherein
the controller IC performs output feedback control of the switching output stage by a PWM (pulse-width modulation) driving method or a PFM (pulse-frequency modulation) driving method.

6. The switching power supply device of claim 1, wherein
the controller IC performs output feedback control of the switching output stage by voltage mode control or current mode control.

7. An electronic appliance, comprising:
the switching power supply device of claim 1; and
a load configured to be supplied with electric power from the switching power supply device.

8. The electronic appliance of claim 7, wherein
the load is a current-driven light-emitting device.

9. The electronic appliance of claim 7, wherein
the load is a battery.

10. A switching power supply device, comprising:
a switching output stage configured to receive electric power from a primary circuit system and supply an output voltage and an output current to a load provided in a secondary circuit system while electrically isolating between the primary and secondary circuit systems;
an output feedback circuit provided in the secondary circuit system and configured to generate a secondary-side feedback current commensurate with the output voltage and the output current;
a photocoupler configured to convert the secondary-side feedback current into an optical signal by use of a light-emitting element provided in the secondary circuit system and convert the optical signal into a primary-side feedback current by use of a light-receiving element provided in the primary circuit system; and
a controller IC provided in the primary circuit system and configured to control the switching output stage according to the primary-side feedback current passing through an output feedback terminal of the controller IC,
wherein
the output feedback circuit includes:
a shunt regulator configured to control the secondary-side feedback current according to a control voltage applied to a control terminal of the shut regulator;
a first resistor connected between an output terminal of the output voltage and the control terminal;
a second resistor connected between the control terminal and a ground terminal;
a sense resistor configured to convert the output current into a sense voltage; and
a first diode of which an anode is connected to an application terminal of the sense voltage or of a voltage commensurate therewith and of which a cathode is connected to the control terminal.

11. The switching power supply device of claim 10, wherein
the output feedback circuit further includes:
an amplification circuit configured to amplify the sense voltage to generate an amplified sense voltage.

12. The switching power supply device of claim 11, wherein
the output feedback circuit further includes:
a voltage division circuit configured to divide the amplified sense voltage at an arbitrary division rate to generate a divided sense voltage.

13. The switching power supply device of claim 10, wherein
the output feedback circuit further includes:

a second diode of which an anode is connected to a connection node between the first and second resistors and of which a cathode is connected to the control terminal.

14. The switching power supply device of claim 10, wherein the switching output stage is of a flyback type or a forward type.

15. The switching power supply device of claim 10 wherein the controller IC performs output feedback control of the switching output stage by a PWM (pulse-width modulation) driving method or a PFM (pulse-frequency modulation) driving method.

16. The switching power supply device of claim 10 wherein the controller IC performs output feedback control of the switching output stage by voltage mode control or current mode control.

17. The switching power supply device of claim 10, further comprising:

an AC-DC converter configured to generate a direct-current voltage from an alternating-current voltage and supplies the direct-current voltage to the switching output stage.

18. An electronic appliance, comprising:

the switching power supply device of claim 10, wherein charging of a battery is controlled by the switching power supply device.

19. A lighting device, comprising:

the switching power supply device of claim 10; and a current-driven light-emitting device configured to emit light by being supplied with electric power from the switching power supply device.

\* \* \* \* \*